(12) United States Patent
Zhuk

(10) Patent No.: US 11,795,830 B2
(45) Date of Patent: Oct. 24, 2023

(54) WATER DROPLET EROSION RESISTANT COATINGS FOR TURBINE BLADES AND OTHER COMPONENTS

(71) Applicant: Hardide PLC, Bicester (GB)

(72) Inventor: Yuri Zhuk, Bicester (GB)

(73) Assignee: Hardide PLC, Bicester (GB)

( * ) Notice: Subject to any disclaimer, the term of this patent is extended or adjusted under 35 U.S.C. 154(b) by 168 days.

(21) Appl. No.: 16/759,245

(22) PCT Filed: Oct. 29, 2018

(86) PCT No.: PCT/GB2018/053124
§ 371 (c)(1),
(2) Date: Apr. 24, 2020

(87) PCT Pub. No.: WO2019/086848
PCT Pub. Date: May 9, 2019

(65) Prior Publication Data
US 2020/0370440 A1    Nov. 26, 2020

(30) Foreign Application Priority Data
Nov. 2, 2017    (GB) ...................................... 1718191

(51) Int. Cl.
*F01D 5/28* (2006.01)
*C22C 19/07* (2006.01)
(Continued)

(52) U.S. Cl.
CPC .............. *F01D 5/288* (2013.01); *C22C 19/07* (2013.01); *C22C 27/04* (2013.01); *C22C 29/08* (2013.01);
(Continued)

(58) Field of Classification Search
None
See application file for complete search history.

(56) References Cited

U.S. PATENT DOCUMENTS 4,427,445 A    1/1984  Holzl et al.
4,741,975 A    5/1988  Naik et al.
(Continued)

FOREIGN PATENT DOCUMENTS

EA    6349 B1      12/2005
EP    1634976 A1   3/2006
(Continued)

OTHER PUBLICATIONS

GB Combined Search and Examination Report under Sections 17 and 18 in Application No. GB1718191.8 dated Apr. 10, 2018.
(Continued)

*Primary Examiner* — Humera N. Sheikh
*Assistant Examiner* — Kim S. Horger
(74) *Attorney, Agent, or Firm* — Berg Hill Greenleaf Ruscitti LLP

(57) ABSTRACT

A material for water droplet erosion- and corrosion-resistant coatings, comprising metallic tungsten alloyed with carbon in a substantially uniform nano-structure that is substantially free of oxygen, other than at surface portions exposed to air or moisture. The coatings disclosed may be particularly resistant to water droplet erosion when coated onto gas or steam turbine blades.

46 Claims, 10 Drawing Sheets

(51) Int. Cl.
  *C22C 27/04* (2006.01)
  *C22C 29/08* (2006.01)
  *C23C 16/08* (2006.01)
  *C23C 16/32* (2006.01)
  *C23C 16/44* (2006.01)
  *C23C 28/02* (2006.01)

(52) U.S. Cl.
  CPC .............. *C23C 16/08* (2013.01); *C23C 16/32* (2013.01); *C23C 16/4408* (2013.01); *C23C 28/027* (2013.01); *F05D 2230/314* (2013.01); *F05D 2230/90* (2013.01); *F05D 2300/2263* (2013.01)

(56) References Cited

U.S. PATENT DOCUMENTS

| | | | |
|---|---|---|---|
| 5,277,987 | A | 1/1994 | Garg et al. |
| 5,702,829 | A | 12/1997 | Paidassi et al. |
| 6,447,932 | B1 | 9/2002 | O'Hara et al. |
| 6,800,383 | B1 | 10/2004 | Lakhotkin et al. |
| 7,160,352 | B2 | 1/2007 | Le Biez et al. |
| 8,043,692 | B2 | 10/2011 | Zhuk et al. |
| 9,346,148 | B2 * | 5/2016 | Zhuk ..................... C04B 41/52 |
| 2010/0266409 | A1 | 10/2010 | Chandra et al. |
| 2012/0125980 | A1 | 5/2012 | Richter et al. |
| 2014/0272166 | A1 | 9/2014 | Shim et al. |
| 2016/0312622 | A1 | 10/2016 | Burbaum et al. |
| 2017/0009591 | A1 | 1/2017 | Flores Renteria et al. |

FOREIGN PATENT DOCUMENTS

| | | | |
|---|---|---|---|
| EP | 1939318 | A2 | 7/2008 |
| EP | 2256228 | A2 | 12/2010 |
| GB | 2509790 | A | 7/2014 |
| JP | H03285071 | A | 12/1991 |
| JP | 2008-516087 | A | 5/2008 |
| JP | 2016-517838 | A | 6/2016 |
| NZ | 513944 | A | 9/2001 |
| RU | 1715152 | A1 | 2/1996 |
| RU | 2342222 | C2 | 12/2008 |
| RU | 2556152 | C2 | 7/2015 |
| RU | 2588973 | C2 | 7/2016 |
| SU | 6574 | A1 | 9/1928 |
| WO | 2006/040545 | A2 | 4/2006 |
| WO | 2006040545 | A2 | 4/2006 |
| WO | WO 2006/040545 | A2 * | 4/2006 ............ C23C 16/14 |
| WO | 2010044936 | A1 | 4/2010 |
| WO | 2011025596 | A1 | 3/2011 |
| WO | 2014/155109 | A1 | 10/2014 |
| WO | 2019/086848 | A2 | 5/2019 |

OTHER PUBLICATIONS

International Search Report and Written Opinion dated Jul. 30, 2019 in Application No. PCT/GB2018/053124, filed Oct. 29, 2018, 21 pages.

J. E. Field et al "Studies of Two-Dimensional Liquid-Wedge Impact and Their Relevance to Liquid-Drop Impact Problems" Source: Proceedings of the Royal Society of London. Series A, Mathematical and Physical Sciences, Oct. 8, 1985, vol. 401, No. 1821 (Oct. 8, 1985), pp. 225-249.

Mohammad Sadegh Mahdipoor "Water Droplet Erosion Resistant Materials and Surface Treatments" Presented in Partial Fulfillment of the Requirements for the Degree of Doctor of Philosophy (Mechanical and Industrial Engineering) at Concordia University Montreal, Quebec, Canada Feb. 2016.

RU Office Action in counterpart RU Application No. 2020118018 dated Jul. 6, 2022.

RU Office Action in counterpart RU Application No. 2020118018 dated Sep. 6, 2022, 9 pages.

VN Substantive Examination Report in counterpart VN Application No. 1-2020-02830 dated Apr. 13, 2023, 4 pages.

JP Office Action in counterpart JP Application No. 2020-524456 dated Nov. 8, 2022, 4 pages.

KR Notice of Non-Final Rejection in counterpart KR Application No. 10-2020-7015133 dated Feb. 28, 2023, 13 pages.

JP Office Action in counterpart JP Application No. 2020-524456 dated Jul. 18, 2023, 11 pages.

* cited by examiner

WATER DROPLET EROSION RESISTANT COATINGS FOR TURBINE BLADES AND OTHER COMPONENTS

CROSS REFERENCE TO RELATED APPLICATION

This application is a national stage application under 35 U.S.C. 371 of PCT Application No. PCT/GB2018/053124 having an international filing date of Oct. 29, 2018, which designated the United Kingdom, which PCT application claimed the benefit of United Kingdom Application Ser. No. 1718191.8, filed Nov. 2, 2017, both of which are incorporated by reference in their entirety. #

The present disclosure relates to coated turbine blades or vanes, more specifically to the turbine blades or vanes of steam turbines and gas turbines used for power generation and also to the blades and vanes used in the low temperature compressor part of an aircraft engine. Certain embodiments also relate to coated pump impellors, valves and other components that may be subject to cavitation erosion in a liquid.

The present disclosure further relates to a coating applied on the aerofoil part of a turbine blade to enhance its surface resistance to erosion, including erosion by high velocity water droplet impact and also erosion by ingested solid particles such as sand, dust and scale. The proposed coating is intended to protect the blades against corrosion, and/or the combined effects of erosion together with corrosion. The proposed coating may also provide resistance to cavitation, particularly on components such as pump impellors and valves that are exposed to liquid flows.

The present disclosure also relates to a chemical vapour deposition (CVD) process developed for producing said coating.

BACKGROUND

Turbine blades are critical parts of steam turbines and gas turbines widely used to generate electricity, and of aircraft turbine engines. They are highly engineered parts often made using advanced materials. To achieve optimum aerodynamic performance, the turbines typically have an aerofoil shape and an optimal surface finish. During turbine operation, the blades often move at a speed close to or exceeding the speed of sound, and are exposed to erosion from high speed water droplet and solid particle impacts, which result in a roughening of the turbine blade surface and a noticeable increase in drag and loss of turbine efficiency.

Some regimes of gas turbine operation use water introduced into the gas flow at the turbine inlet to increase the mass flow and improve the turbine efficiency. Water fogging is sometimes used to clean deposit build-up from the blades. Water droplets from the fogging spray impinge on the leading edges of the first four to five rows of turbine blades and can give rise to water droplet erosion (WDE), mainly on the leading edges of the blades, making the blade surfaces rough and increasing blade friction and drag.

In steam turbines, the rapid expansion of steam leads to water condensation towards the last rows of the turbine. Water condensate droplets can accumulate on stationary turbine vane surfaces forming larger droplets which can impact the leading edges of rotating blades, thus causing WDE. This is particularly problematic close to the tips of the rotating blades where the impact speed is maximum. WDE is considered to be unavoidable under the wet steam operating conditions of a steam turbine.

WDE mechanisms are not fully understood, and include multiple factors: high velocity water droplet impacts resulting in deformation of the blade material, high velocity water jetting, shock waves in the liquid and stress waves in the metal, cavitation bubbles in the liquid, and hydraulic penetration. In some turbine operating conditions these mechanical factors may also be accelerated by chemical and corrosive effects. Due to the discrete nature of the impacts, the metal surface is exposed to fatigue conditions resulting in fatigue cracking initiation, propagation and intersection, which in turn can lead to progressive loss of blade material. The solid surface response to the water droplet impacts has an impulsive character and is determined by dynamic rather than static mechanical characteristics. The reaction of a metal surface to WDE changes over time, starting with an initial incubation stage when the metal surface undergoes deformation, work hardening, introduction of defects like dislocations, twinning, crack initiation and surface roughening without loss of material. This usually affects the top 30 to 50 μm layer of the metal. This is followed by an erosion acceleration stage when material removal is accelerated due to propagation of subsurface cracks and intersections leading to loss of material particles, lateral water jetting with velocities many times higher than the droplet impact velocity, and removing asperities and deformed material by a tearing action. A distinct feature of WDE is that the eroded metal surface becomes very rough. High velocity water droplets impacting over a pre-existing crack or pit can expand the crack or pit and lead to metal surface tunnelling and upheaval by water jetting and hydraulic penetration. After some time, the erosion rate reaches its maximum and the rate of WDE starts to reduce in a deceleration/attenuation stage, possibly due to the dampening effect of the water cushion retained in the deep pits and cavities formed in the metal surface, but even at this stage the erosion continues, albeit at a lower rate. Some brittle materials or coatings do not demonstrate this WDE deceleration/attenuation stage and instead undergo in increase in erosion rate leading to a so-called catastrophic stage, at which the material or coating fails entirely.

Different materials are affected by WDE to different degrees, and in different ways. For example, the surface of a ductile material will be plastically deformed by impacts forming depressions, around which the upraised edges and asperities can be removed by the shearing action of high velocity lateral water jetting. Harder, brittle materials, on the other hand, tend to form fissures and fatigue cracks after repeated impacts. Materials with a non-homogeneous structure, such as thermal spray coatings consisting of tungsten carbide particles in a cobalt metal matrix, tend to have damage initiated at weak spots or weaker components. Porosity, mechanically weak inclusions and defects in the material surface layer can become stress concentrators where subsurface cracks can be initiated. A higher concentration of porosity, inclusions and defects in the surface layer of the material can accelerate the incubation stage and the start of material loss, making such materials less able to resist WDE. It is believed that the WDE degradation of a material at different stages can involve all or most of the mechanisms mentioned above. Due to the complexity of the WDE process, there is no unified theory of WDE development and no general approach to predict the resistance of a material to WDE or to develop materials that can protect against WDE. Despite extensive research in this area, the development of a universal approach to protect against WDE is deemed impossible. There are only some empirical rules which work for some types of materials but not for others. There is no single material parameter which can reliably characterise a material's ability to resist WDE.

One factor which is most often considered important is hardness. It is generally believed that the hardness of a material has a strong effect on the WDE erosion resistance: for similar materials, the erosion resistance is expected to be proportional to the $2^{nd}$ or $2.5^{th}$ power of the Vickers hardness number [Heymann, F. J.; "Toward Quantitative Prediction of Liquid Impact Erosion"; STP 474; ASTM; 1970; pp. 212-248].

Alloying elements in steel and alloys of other metals, as well as the microstructure of the alloys, are considered important factors affecting their resistance to WDE. Cobalt-chromium-tungsten alloys such as Stellite® have been found to be highly resistant to WDE, and this is generally considered to result from their microstructure.

Corrosion can affect turbine blade surfaces, and when combined with WDE and/or with solid particle erosion, the corrosion and erosion may have some synergy when the passive surface oxide layer present on many alloys is lost due to erosion, thus accelerating corrosion. Corrosion can be an issue for turbines installed near sea coastal regions where salt particles and/or salt water droplets are present in the air. Additives or impurities from feed-water can concentrate in so called "early condensates", leading to significant corrosion damage and stress-corrosion cracking of turbine components. For example, the thermal decomposition of ethanolamine ETA used as a pH conditioner and chelating agent can produce corrosive organic acids.

BACKGROUND

Coatings are widely used on turbine blades, vanes and other components. There are several types of coatings, each type addressing a separate issue:
  i) thermal barrier coatings applied on hot zone blades to allow more efficient higher temperature operation of the turbine,
  ii) abrasive coatings applied on blade tips to cut an abradable shroud so as to form an air/gas seal system,
  iii) corrosion-resistant coatings applied to prevent corrosion of the blades, and
  iv) erosion-resistant coatings.

Coatings developed to resolve i) and ii) are often not effective in addressing iii) and iv) due to the different natures of the coatings.

The present disclosure is particularly directed to coatings of types iii) and iv), designed to improve the resistance of turbine parts to erosion (both water droplet erosion and solid particle erosion), and also to corrosion.

US 2012/0125980 (WO 2011/009430) describes a method for coating a turbine blade with Co-Cr alloy, where the hardfacing coating is produced separately and is then joined to the component surface in a high-temperature soldering process. Co-Cr alloys such as Stellite 6 and Stellite 21 in the form of a bulk material have indeed shown excellent resistance to WDE. However, their use as a protective hardfacing attached by soldering or brazing raises a number of difficulties. During turbine operation, the soldering alloy can be attacked due to corrosion, including possible bi-metallic or in some cases crevice corrosion. Residual stresses in the brazing joint and other mechanical stresses can further weaken the brazing joint strength during turbine operation. Some turbine blade designs allow torsional deformation of the blades in operation due to mechanical forces, this applies additional stresses to the joint between the base steel and the Co-Cr hardfacing. Over time these factors can result in the hardfacing layer separating from the blade body. During turbine operation, the blades often move at speed close to or in some cases exceeding the speed of sound, and the detachment of hard, heavy pieces of hardfacing can cause catastrophic damage to the turbine.

Methods such as laser cladding and thermal spraying are sometimes used to apply a thinner layer of Co-Cr alloy. These methods, however, can introduce tensile stresses in the layer which over time can lead to cracking. Surface cracks and micro-cracks can become stress concentrators, negatively affecting the fatigue properties of the turbine blades, which are important for the durability of these fast-moving stressed parts.

US 2010/0266409 (WO 2007/101465) discloses a thermal barrier coating used on turbine blades. A hollow, internally cooled blade of a gas turbine is coated with an MCrAlY-based bonding layer and a ceramic thermal barrier layer of zirconium oxide on the outer side of the blade, and an inner coating comprising a Cr diffusion layer.

US 2016/0312622 describes the production of a two-layer coating with a bonding layer made of MCrAlX; where M is at least one element selected from the group consisting of iron (Fe), cobalt (Co), nickel (Ni), X is an active element and stands for yttrium (Y) and/or silicon, scandium (Sc) and/or at least one rare earth element, or hafnium. The bonding layer thickness is between 20 μm and 50 μm. The thermal barrier coating is produced on top of the bonding layer by electron beam physical vapor deposition (EB-PVD), and consists for example of $ZrO_2$, $Y_2O_3$—$ZrO_2$. In other words, unstabilized, partially stabilized or fully stabilized by yttrium oxide and/or calcium oxide and/or magnesium oxide may also be present on the MCrAlX. The two-layer coating can then be provided with connected cooling system flow ducts generated, for example, by selective laser melting.

RU 2588973 discloses the production of a heat shielding coating by plasma sputtering a coating of zirconium oxide stabilized by yttrium onto a prepared surface of parts made from a nickel-based alloy. The coating may be provided with a gradient transition layer by means of two magnetrons.

The disclosures mentioned above focus on the thermal barrier coating. The heat-insulating properties of the thermal barrier coating are determined by a ceramic layer with low thermal conductivity, which represents the actual barrier against heat flow. The thermal barrier coating is used on the turbine blades in the high temperature part of a gas turbine. The use of these coatings allows the operating temperature of the turbine to be increased, which therefore improves efficiency. Ceramic thermal barrier coatings are advanced materials designed to have a specific combination of properties, such as: low heat conductivity, high melting point, phase composition and chemical stability, matched coefficients of thermal expansion for all coating layers, high thermal fatigue and oxidation resistance. These materials are typically brittle and are not strong mechanically, and as such they do not have erosion-resistant properties. Additionally, because the thermal barrier coated blades operate in a high temperature part of a gas turbine, typically between 1000° C. to 1600° C., water droplet erosion is not a problem since no water droplets will be present. Accordingly, no resistance to WDE is required.

US 2017/0009591 describes compressor blades or vanes which consist of a metal alloy having an aluminium diffusion zone on a surface of the blade or vane substrate with a thickness of 10 to 30 μm. The compressor blades or vanes have a hard material coating which comprises TiN, TiAlN, AlTiN, CrN as single-layer or multi-layer ceramics, typically produced by physical vapour deposition (PVD). The hard material coating provides erosion resistance, and the aluminium diffusion layer provides corrosion protection. However, the hard PVD coatings are typically rather thin, being just 3 to 4 μm thick, and do not provide sufficient erosion protection.

U.S. Pat. Nos. 6,800,383 and 8,043,692 describe coatings developed as wear-resistant coating for metal parts. The structure and mechanical properties of these coatings are not considered to be optimal for protection of turbine blades against WDE and combined erosion/corrosion attack.

U.S. Pat. No. 6,800,383 describes coatings consisting mainly of single-phase tungsten carbides, their mixtures, as well as mixtures with carbon and with metal tungsten, for example: WC+C, WC, WC+$W_2C$, $W_2C$, $W_2C$+$W_3C$, $W_2C$+$W_{12}C$, $W_2C$+$W_3C$+$W_{12}C$, $W_3C$, $W_3C$+$W_{12}C$, $W_{12}C$, WC+W, $W_2C$+W, $W_3C$+W, $W_{12}C$+W, $W_3C$+$W_{12}C$+W. In all cases, U.S. Pat. No. 6,800,383 describes compositions based on tungsten carbide(s) as the main phase, with tungsten being an admixture impurity, as proved by X-ray diffraction analysis. These tungsten carbide compositions have high hardness, up to 3500 kg/mm$^2$. The carbon content in these coating materials can be up to 15 wt % and the fluorine content up to 0.5 wt %. Like most other carbides, these materials are quite brittle and mechanically highly stressed. Mixtures of different phases produced by this method tend to have very high residual stresses. Admixtures of mechanically-weak carbon and brittle subcarbides $W_3C$ and $W_{12}C$ can reduce the fracture toughness and impact-resistance of the coating, these properties being important for erosion resistance. These coatings may contain excessive amounts of fluorine, up to 0.5 wt %, which can be detrimental for the adhesion and protective properties of the coating, especially if coated items are used in the presence of water or oxygen as in the case of blades for steam and gas turbines.

U. S. Pat. No. 8,043,692 describes tungsten alloyed with carbon in an amount of 0.01 wt % up to 0.97 wt % and additionally alloyed with fluorine in an amount of 0.001 wt % up to 0.4 wt %. The material has high hardness up to 2000 Hv, in some embodiments up to 2200 Hv, this is important for wear resistance, but this high hardness was surprisingly found detrimental for erosion resistance and especially for WDE resistance. The process described in U.S. Pat. No. 8,043,692 does not control or prevent the presence of oxygen or water in the coating chamber, or adsorbed on the parts being coated or present in the precursor gases. The fact that even traces of oxygen and water in the CVD process chamber can affect the coating properties has only just been discovered by the present Applicant. The industrial grade hydrogen used as a reducing gas in known CVD processes contains water vapour and not insignificant traces of oxygen. Industrial grade hydrogen is normally produced by electrolysis, and as a result contains significant amounts of water vapour and often traces of oxygen. The present Applicant has found that large CVD reactors, which may have internal stainless steel surfaces of area more than 10 m$^2$ inside the vacuum chamber, adsorb a significant amount of water vapour when the chamber is opened after CVD processing. This is especially the case in water-cooled areas of the reactor chamber such as the cooled vacuum seal area, where visible water condensation has been noted. It has also been found that the stainless steel surfaces can adsorb oxygen. The present Applicant has surprisingly found that de-gassing the vacuum chamber before each CVD cycle and using higher purity gases (in particular the hydrogen reducing gas and alkane gas) will result in a substantially oxygen-free coating with significantly improved mechanical properties.

It was surprisingly found that even trace amounts of oxygen can form inclusions of mechanically-weak non-volatile tungsten oxy-fluorides, which can become stress-concentrators and/or points of sub-surface micro-crack initiation, these being the main mechanisms of WDE. The materials described in U.S. Pat. No. 8,043,692 may contain a high amount of carbon (up to 0.97 wt %), which can negatively affect fracture toughness and resistance to repeated impacts when exposed to solid particle or water droplet erosion. These materials may contain excessive amounts of fluorine, up to 0.4 wt %, which can negatively affect the coating adhesion and protective properties, especially for steam and gas turbine blades operating in the presence of water and oxygen for prolonged periods of time. The method described in U.S. Pat. No. 8,043,692 does not control the residual stresses and the porosity in the resulting coating, these being important factors in the material fatigue properties and resistance to erosion, especially to WDE.

EP 2256228 discloses a two layer coating for protecting a surface against erosion by particles such as sand dirt and dust or by repetitive high velocity fluid impingement such as rain or other fluids. The first layer is stated to be in the form of a metal matrix with ceramic reinforcement with hardness 10 to 20 GPa and thickness 75 to 500 microns. The first layer may be applied by HVOF, cold spray or other processes suitable for applying a cermet, the layer composition is selected from the following group: WC/Co, WC/CoCr, Chromium Carbide-Nickel Chrome, Diamond-Nickel. The second layer, which is typically a ceramic with hardness 19 to 40 GPa or higher and thickness between 1 and 25 microns, is applied by PVD or CVD, and is made of materials selected from the following group: TiN, Diamond, Diamond-like Carbon, CrN, Cubic Boron Nitride, Boron Carbide, TiC or their combinations. The surface to be coated may be an aircraft propulsion system component such as a helicopter rotor blade, propeller blade or fan blade, wind of water turbines, impellers, sea vessel propellers or large piping systems.

The coating layers described in EP2256228 are not considered to be optimal for providing WDE resistance in steam turbines. In particular, the hard ceramic second layer is brittle, and brittle materials are known to fracture quickly under repeated WDE impacts typically leading to a catastrophic failure. HVOF and other spraying coating methods used to produce the first layer typically have tensile residual stresses and are also brittle, this being unsuitable for providing effective WDE protection. HVOF and other spray coating methods produce coatings with uneven thickness and a very rough surface, which will require post-coating grinding or polishing to achieve a surface finish desirable for turbine blades. This post-coating grinding operation is relatively straightforward on parts having a simple geometry, such as cylindrical or flat parts. However, post-coating grinding of highly engineered turbine blades with complex 3D shapes would be very difficult. Application of the harder, second layer by vacuum PVD or CVD coating methods imposes strict requirements on the cleanliness of the substrate. This can be problematic, since the first layer porous HVOF coating, after grinding, will be contaminated with cutting-coolant fluids and oils which will make application of the second hard layer very difficult in practice.

U.S. Pat. No. 4,741,975 discloses a multilayer coating on gas turbine engine blades to improve their resistance to erosion by sand and dust particles without exhibiting a sharp drop in fatigue life. The coating has a first ductile layer comprising palladium, platinum or nickel, a second layer of substantially pure tungsten and a third erosion-resistant layer of tungsten-carbon alloy or a tungsten metal matrix with a dispersed mixture of tungsten-carbon phases. The relatively hard outer coating has hardness from 1600 DPH to 2400 DPH and preferably from 1900 DPH to 2000 DPH. The coating contains 93.88 to 97.8% tungsten and 2.12 to 6.12% carbon. The Diamond Pyramid Hardness (DPH) units used in this document are equivalent to the more widely used Vickers Pyramid Number (HV). This hard outer coating can be deposited either by CVD or by sputtering methods. If sputtering is used, the layer composition range will include compounds from WC to $W_3C$, particularly $W_2C$. If CVD is used, reference is made to U.S. Pat. No. 4,427,445, which is described below.

U.S. Pat. No. 4,427,445 discloses a CVD process using $WF_6$, hydrogen, dimethyl ether ($CH_3OCH_3$) and nitrogen. The material produced under the specific conditions of this patent is a two-phase mixture, one phase being pure tungsten in an amount 20-90 wt % and the other phase being an A15 structure, where the A15 structure is either a tungsten carbide or a tungsten carbide and tungsten oxide mix. This is confirmed by X-ray diffraction analysis. The deposited material in U.S. Pat. No. 4,427,445 is very hard (1820 to 2500 VHN—equivalent to HV) and highly stressed and may require additional heat treatment at 600 to 700° C. Such heat treatment is not acceptable for some steels which may distort and lose certain desirable mechanical properties.

U.S. Pat. No. 4,427,445 uses oxygen-containing precursors, such as methanol, ethanol, dimethyl ether, aldehydes and ketones, and recommends using mixtures of organic precursors to tailor the hardness of the material produced.

U.S. Pat. No. 4,741,975 also states that the CVD gaseous mixture includes organic compounds containing carbon, oxygen and hydrogen (column 6, lines 23-27). The use of oxygen-containing precursors leads to substantial inclusions of tungsten oxides and oxy-fluorides in the deposited material.

U.S. Pat. No. 4,741,975 discloses a coating for protecting gas turbine engines against erosion by sand and dust particles, and does not mention steam turbines or problems associated with water droplet erosion. Erosion by solid particles takes place by different mechanisms to those involved in WDE, predominantly micro-cutting, and therefore resistance to solid particle erosion requires high surface hardness. The hard coating of U.S. Pat. No. 4,741,975 comprises brittle tungsten carbide macro-phases WC, $W_2C$ and $W_3C$, and also includes not insubstantial amounts of tungsten oxides and oxy-fluorides. When exposed to WDE, hard coatings with these characteristics may suffer from brittle failure, fatigue micro-cracks and will not provide sufficient protection.

WO 2010/044936 discloses gas turbine blades (with particular reference to helicopter engines) and distinguishes between leading edge impact damage and erosion of the aerofoil caused by glancing particle blows by solid particles entrained in the air ingested by the engine. The turbine blades are provided with a multilayer PVD nitride ceramic coating of one of three compositions: TiAlN, CrN, TiSiCN. This is stated to be more erosion-resistant than a tungsten carbide coating deposited by an HVOF technique. It is noted that PVD coatings are also susceptible to cracking and delamination when bombarded with round particles. There is no consideration of the particular problem of water droplet erosion. The coatings described in this patent are brittle ceramic materials under high residual stresses, which may be prone to cracking and spallation when exposed to repeated impacts, and are not suited to providing protection against WDE.

WO 2011/025596 builds on WO 2010/044936 to disclose multilayer PVD nitride ceramic coatings for protecting gas turbine blades. Only some areas of the blade aerofoils are coated, for example only concave surfaces in some embodiments, and both concave and convex surfaces in others. The disclosure further contrasts the columnar microstructure of PVD coatings with the non-columnar "splat"-like nature of thermally sprayed coatings. PVD coatings of various nitrides are stated to be particularly effective, and the columnar microstructure is emphasised. As in WO 2010/044936, the coatings are not expected to provide sufficient protection against WDE, due to their brittle nature and the high residual stresses of the ceramic PVD coatings. In addition, some PVD coatings have significant porosity which can provide pathways for corrosive media to attack the underlying substrate.

U.S. Pat. No. 6,447,932 discloses coating systems for gas turbine components made of a superalloy substrate with nitrided regions, aluminium-rich coatings and optionally a thermally insulating ceramic layer. This patent focuses on the high temperature area of the gas turbine engine, and the coatings described have been developed to withstand high temperatures and high thermal cycling stresses. These coatings are not expected to protect the blades against WDE, solid particle erosion or corrosion.

EP 1939318 relates to carburisation of a nickel-based substrate (e.g. a superalloy) so as to inhibit secondary reactions with a subsequently-applied aluminium-rich coating, particularly in relation to the components of the gas turbine high temperature part. The carburising surface treatment and coatings described in this patent do not protect the blades against WDE, solid particle erosion or water corrosion.

EP 1634976 discloses coating techniques for use on high temperature, high pressure turbine components. A mixture of MCrAlY powder with an abrasive powder is applied by cold gas dynamic spraying, which may be followed by heat treatment. This coating is stated to protect components of the gas turbine high temperature area, and are not considered to be suitable protection against WDE or water corrosion.

WO 2014/143244 (US 2014/0272166) discloses coatings applied to a preselected exterior surface of airfoil blades, such as the leading edge surface of the airfoil or the concave side surface, or the convex side surface, or combinations thereof. There is disclosed a very wide range of coatings and surface treatments applied by high velocity oxygen fuel spray, high velocity air fuel spray, solution plasma spray, cold spray, chemical vapor deposition, electro spark deposition, plasma enhanced chemical vapor deposition, or air plasma spray. The coatings may be formed from TiAlN, AlTiN, TiAlN/TiN multilayer, TiAlN/Cr multilayer, tungsten-tungsten carbide, tungsten carbide cobalt, cobalt-chrome-tungsten carbide, chrome carbide-nickel, chrome carbide-nickel-chrome, or a diamond like carbon material. Further disclosed is nitriding and carburising the blade material and applying a bond coat.

This document focuses on protecting blades of gas turbines against solid particle erosion, in particular with regard to coatings to provide enhanced high angle solid particle erosion protection on the leading edge of compressor airfoils, and may also provide low angle solid particle erosion protection on the concave 16 and convex 18 sides of the airfoils. This document does not consider WDE and does not make reference to steam turbine parts.

To resist erosion by solid particles, the coatings described in WO 2014/143244 (US 2014/0272166) must have a high hardness of the coating layer between about 1,200 Hv and about 2,000 HV, preferably between about 1,400 HV and about 1,600 HV. This high hardness of the coatings increases the risk of fracture under impact. Moreover, no consideration is given to the porosity of the coatings, which can affect their resistance to WDE and also their effectiveness as a corrosion barrier, nor to the question of residual stresses in the coatings, which can affect their resistance to the initiation and propagation of micro-cracks. Nor is there any detailed analysis of the composition of the coatings.

BRIEF SUMMARY OF THE DISCLOSURE

Viewed from a first aspect, there is provided an erosion- and corrosion-resistant material coated on a substrate, the material comprising metallic tungsten alloyed with carbon in a substantially uniform nano-structure that is substantially free of oxygen, other than at surface portions exposed to air or moisture, wherein the material has a columnar crystalline microstructure.

Viewed from a second aspect, there is provided a water droplet erosion resistant material coated on a substrate, the material comprising metallic tungsten alloyed with carbon in a substantially uniform nano-structure that is substantially free of oxygen, other than at surface portions exposed to air or moisture, wherein the material has a columnar crystalline microstructure.

Alloying of metals is a complex physical-chemical phenomenon of significant practical interest. For example, alloying of iron with various amounts of carbon under various conditions might change its mechanical and physical properties dramatically from mild iron, to low carbon steel, high carbon steel and pig iron. The properties of steel, first of all its hardness and ductility, significantly depend on the carbon content and the form in which carbon is present in steel (e.g. as free cementite $Fe_3C$ or alternatively as an interstitial solid solution of carbon in iron).

Alloying should be distinguished from inclusions or simple mechanical mixing of several materials. For example, free carbon inclusions into iron can have a negative effect on its mechanical properties, whereas as alloying can improve its mechanical properties.

In the context of the present application, the term "tungsten alloyed with carbon" encompasses a matrix of metallic tungsten with interdispersed tungsten carbide nanoparticles. In other words, the material is primarily metallic tungsten. The tungsten carbide nanoparticles are sufficiently small that they do not give rise to peaks characteristic of tungsten carbide under X-ray diffraction analysis.

An alloy of tungsten and carbon is not the same as the compound tungsten carbide, nor is it simply a mixture of tungsten and carbon. Alloying is to be distinguished from simple inclusions or the like. For example, free carbon inclusions in iron generally have a negative effect on its mechanical properties.

After extensive experimentation and analysis, the inventors in respect of the present application have found that alloying of tungsten with various predetermined amounts of carbon can significantly change the properties of the material.

Too low an amount of carbon has little or no effect on the physical properties of the tungsten. On the other hand, too high an amount of carbon can cause high stresses and can result in cracking of the alloyed tungsten layer. Under certain conditions, excessive carbon can cause precipitation of carbon or carbides at micro-grain boundaries, negatively affecting both mechanical properties and corrosion resistance Moreover, the substantial absence of oxygen or oxy-compounds in the bulk material (disregarding any surface oxide layer resulting from exposure to air or moisture) helps to improve the toughness of the material. In particular, inclusions of non-volatile and mechanically weak tungsten oxy-fluorides, such as $WOF_4$, $WO_2F_2$, $WO_2F_4$ and others, can act as stress concentrators and initiation points for sub-surface micro-cracks. Some tungsten oxy-fluorides can react with oxygen and water further affecting the mechanical and corrosion-protective properties of the material. It was surprisingly found that substantially oxygen-free, alloyed tungsten has enhanced mechanical and fatigue properties and provides better protection against erosion, including WDE, and against corrosion.

Embodiments of the present disclosure have a substantially uniform fine-scale nano-structure which can help prevent formation of stress-concentrators thus reducing risk of cracks initiation within the material or a coating layer made of the material. These factors have been found, after extensive research and experimentation, to play an important role in the protection of turbine blades against WDE and to some degree against solid particle erosion and also against corrosion.

Extensive experimental work by the present Applicant has determined that there are a number of factors to be taken into account when seeking to protect turbine blades, vanes and other parts against water droplet erosion, solid particle erosion and/or corrosion. An ideal coating on turbine blades and the like should have a combination of properties and characteristics, including one or more of the following:
  i) enhanced resistance to water droplet erosion;
  ii) enhanced resistance to solid particle erosion;
  iii) corrosion-protective properties and low porosity to insulate the substrate material from corrosive fluid attack;
  iv) good uniformity of the deposited coating thickness so as to maintain the 3D shape of aerofoil blades without post-coating grinding;
  v) strong adhesion bond of the coating to metal blade;
  vi) sufficient thickness, suitable structure and mechanical properties to resist water droplet erosion;
  vii) the coating preferably should be under compressive residual stress, to prevent the initiation and propagation of cracks and to enhance its fatigue resistance properties;
  viii) the compressive stress should not be excessive, as this could cause horizontal cracking and cohesive failure of the coating;
  ix) sufficient hardness to resist mechanical abrasion, but also enhanced toughness and ductility to prevent the coating against brittle failure and micro-cracking during mechanical or thermal shocks or in multiple impact fatigue conditions;
  x) the coating surface in its "as deposited" condition should have low roughness and, where necessary, be suitable for polishing to the surface finish required on the turbine blades, typically around (or less than) 0.2 microns Ra (this is advantageous since the complex 3D aerofoil shape of turbine blades or vanes complicates post-coating finishing).

The present Applicant has undertaken extensive experimentation, involving producing and analysing a variety of coatings with different structures and mechanical properties, and has investigated the effect of these structures and mechanical properties on the resistance of the coatings to WDE, solid particle erosion, fatigue and corrosion.

Through extensive experimentation, it was surprisingly found that the optimum resistance against WDE can be achieved by using coatings with moderate hardness. This contradicts the generally accepted opinion that for similar materials, the erosion resistance is expected to be proportional to the $2^{nd}$ or $2.5^{th}$ power of the Vickers hardness number.

Fractures can initiate and develop in areas where tensile stresses in the material exceed its maximum tensile stress threshold. To address this problem, the present Applicant has developed methods for producing a coating material under residual compressive stress. This can partly compensate for propagating tensile stress waves caused by water droplet and solid particle impact and can thus reduce the maximum tensile stress in the wave, which in turn can reduce the risk of fracture initiation and development. The present Applicant has additionally determined that very high residual compressive stresses in the plane of the coating can be detrimental for WDE resistance since they can produce tensile stresses in a direction perpendicular to the plane due to the Poisson effect, the phenomenon in which a material tends to expand in directions perpendicular to the direction of compression. Tensile stresses due to the Poisson effect can add to the stress waves in the metal generated by the high velocity water droplets impacts, and the expansion phase of the stress wave added to the Poisson effect tensile stress can exceed the yield strength or even ultimate strength of the coating material, resulting in deformation or fracture of the coating.

The present Applicant has determined, by way of modeling and experimentation, that for a coating to be used as protection against water droplet erosion on a turbine blade or vane, an optimal range for the residual compressive stresses in the coating is between 520 MPa to 5.3 GPa, optionally from 810 MPa to 2.63 GPa. Through extensive experimentation, the present Applicant has found that one or more of the following process conditions may give rise to the optimal range of residual compressive stress:
  i) maintaining a coating process temperature within a range between 320° C. and 580° C.;
  ii) maintaining a coating deposition rate within a range from 3.5 to 82 µm per hour, optionally from 4 to 18 µm per hour;
  iii) maintaining an average post-coating cooling rate within a range between 0.12° C. per minute to 1.9° C. per minute;
  iv) polishing turbine parts, optionally undertaking other post-coating finishing operations, to achieve a surface finish roughness of no more than 0.2 microns Ra.

The damaging effects of the stress waves induced by WDE impacts can be increased by the presence of porosity, structural defects and mechanically weak inclusions in the coating, which can interact with the stress wave to become stress concentrators and sites of micro-crack initiation. By analysis, it was found that particularly tungsten oxides and tungsten oxy-fluorides can form mechanically weak inclusions and defects in the coating structure which can become micro-crack initiation sites. It was additionally found that these undesirable inclusions are formed due to reactions of precursor gases with traces of oxygen and water, and also if the process involves oxygen-containing precursor gases such as methanol, ethanol, dimethyl ether, or other gases containing traces of oxygen or water, under certain temperature and pressure conditions producing non-volatile and mechanically weak tungsten oxides and oxy-fluorides.

The metallic tungsten may be alloyed with carbon in an amount of 0.0001 to 0.37 wt % based on the total weight of the material; optionally in an amount of 0.0001 to 0.21 wt % based on the total weight of the material. It was found by extensive experimentation that alloying carbon present in higher concentrations under certain conditions can result in precipitation of either tungsten carbides or free carbon at the grain boundaries. When present with sufficient density, such precipitates can reduce the fracture toughness of the material, as well as the ultimate strength, creep resistance and other mechanical properties. It was also found that an alloying carbon content in excess of the above limits can result in an increase of residual stresses in the material, making it prone to cohesive failure under WDE conditions.

The material may consist essentially of metallic tungsten alloyed with carbon, optionally further alloyed with fluorine. That is to say, the bulk material (not including any surface oxide layer that may be present due to exposure to air and/or moisture) may include no components, save for trace impurities, other than tungsten alloyed with carbon, optionally further alloyed with fluorine.

The metallic tungsten alloyed with carbon may additionally be alloyed with fluorine in an amount of 0.0004 to 0.31 wt % based on the total weight of the material; optionally in an amount of 0.0014 to 0.19 wt % based on the total weight of the material. It was found by extensive experimentation that alloying fluorine present in higher concentrations can negatively affect the coating adhesion and protective properties, especially for steam and gas turbine blades operating in the presence of water and oxygen for prolonged periods of time.

The material may be substantially free of oxyfluorides.

The material may be characterised in that it does not exhibit peaks characteristic of inclusions having an A15 crystal structure, such as tungsten carbides, when subjected to X-ray diffraction analysis.

There are special and unexpected technical advantages obtained by way of a matrix of metallic tungsten with dispersed tungsten carbide nanoparticles that are sufficiently small so as not to be visible under X-ray diffraction analysis.

A unique aspect of nanotechnology is the vastly increased ratio of surface area to volume present in many nanoscale materials which opens new possibilities in surface-based science, such as catalysis. A number of physical phenomena become noticeably pronounced as the size of the system decreases. These include statistical mechanical effects, as well as quantum mechanical effects, for example the "quantum size effect" where the electronic properties of solids are altered with great reductions in particle size. This effect does not come into play by going from macro to micro dimensions. However, it becomes dominant when the nanometre size range is reached. Additionally, a number of physical properties change when compared to macroscopic systems. One example is the increase in surface area to volume of materials.

In accordance with Scherrer's formula, the width of the diffraction lines in an X-ray diffraction pattern increases with a reduction in the size of the solid crystallites. Typically, crystallites smaller than around 10 µm in size dispersed in a matrix material do not produce well-defined X-ray diffraction spectrum lines. The fact that tungsten carbide particles forming the tungsten alloyed with carbon material of embodiments of the present disclosure are not detectable by way of X-ray diffraction as shown in FIG. 1 (but may, in certain cases, be seen by High Resolution Electron Microscopy) confirms that the tungsten carbide particle precipitates do indeed have nanometre scale sizes. The X-ray diffraction spectrum of the CVD partly-carbided tungsten coating of certain embodiments of the present disclosure shows all the typical metal tungsten lines, but none of the lines characteristic for various tungsten carbides WC, $WC_{1-x}$, $W_2C$, $W_3C$ are present in the sample spectrum. The surprising quantum mechanical effects that are seen as a result include a combination of material hardness with toughness and impact-resistance (low brittleness). Most hard materials are brittle, but the material of embodiments of the present disclosure combines both hardness and toughness in a way that is of significant and surprising practical importance.

In some embodiments, the material is or comprises a single crystallographic phase of metal tungsten with dispersed tungsten carbide nanoparticles.

The tungsten carbide nanoparticles may have an average particle size not greater than 100 μm; optionally not greater than 50 μm; optionally not greater than 10 μm.

In contrast to the material of U.S. Pat. Nos. 4,427,445 and 4,741,975, the material of embodiments of the present disclosure is produced using different precursor gases, more specifically oxygen-free precursors, has a different composition (significantly lower carbon content at 0.0001 to 0.37 wt % compared to 2.12 to 6.12% carbon in U.S. Pat. No. 4,427,445; substantially oxygen-free as compared to containing A15 tungsten oxides and oxy-fluorides), different tungsten carbide phases, different structure (nano-structure as opposed to a micro/macro-structure), lower residual stresses and different mechanical properties (in particular hardness and toughness/brittleness).

The nano-structure of embodiments of the present disclosure may be confirmed their X-ray diffraction spectra, which containing only lines or peaks characteristic of tungsten as shown in FIG. 1. The nano-structured materials of the present disclosure have better ductility, improved toughness combined with sufficient hardness, and significantly better resistance to both WDE and solid particle erosion. The material is alloyed with carbon to achieve enhanced hardness and does not require additional heat treatment. The inclusion of tungsten carbides in the form of micro- or macro-particles including carbides with an A15 structure is not desirable, since these carbides are highly stressed and can act as initiation points for micro-cracks.

The material may be substantially non-porous. In some embodiments, the material has a porosity of less than 0.5% volume, optionally less than 0.3% volume, optionally less than 0.2% volume, optionally less than 0.15% volume.

Pores in a coating can act as stress concentrators and initiation points for micro-cracks. High velocity droplet impacts on surface and near-surface porosity can deform and expand the pores by hydraulic penetration and lateral water jetting, leading to metal tunnelling and upheaval. These processes are considered to be a significant contribution to water droplet erosion, and it is therefore desirable to reduce or minimise porosity.

The composition of the material may be 97.60 to 99.99 wt % tungsten.

The material may have a hardness from 4.4 GPa to 19 GPa, optionally from 8 GPa to 16 GPa. It has been found that materials that are too hard can undergo a brittle failure mode or cracking when subjected to high-cycle, high-velocity water droplet impacts.

The material may have a fracture toughness of at least 9 MPa·m$^{1/2}$. This can help to provide better resistance to high-cycle, high-velocity water droplet and solid particle impacts.

The material has a columnar or substantially columnar crystalline microstructure. This is distinguished from materials formed by thermal spray processes which tend to have laminar or "splat"-like microstructures.

The material is preferably substantially free from porosity, voids and/or inclusions that act as stress concentrators.

Viewed from a third aspect, there is provided a chemical vapour deposition material coated on a substrate of the first or second aspects.

The material of the coating may have a residual compressive stress on the substrate of 520 MPa to 5.3 GPa, optionally from 810 MPa to 2.63 GPa. Compressive residual stresses may help to improve fatigue resistance to the high cycle impacts of water droplets and help to prevent cracking of the coating. It is to be noted that coatings applied by way of thermal spray processes tend to have residual tensile, rather than compressive, stresses.

The coating may have a thickness of at least 15 μm, optionally at least 50 μm. The coating may have a thickness no greater than 200 μm, optionally no greater than 100 μm.

For a coating on a substrate, stress waves resulting from an impact on the surface of the coating will be at least partially reflected from the coating/substrate boundary. Care must be taken so that constructive interference between direct and reflected stress waves does not exceed the strength limit of the coating, which may cause damage. Thicker coatings can dissipate stress waves better than thinner coatings. One factor is that the energy density of a spherical stress wave is reduced as the square of distance, and thus the energy density of a stress wave reaching the coating/substrate boundary is reduced as the square of the coating thickness. However, coatings that are too thick can distort the carefully-engineered shape and profile of a turbine blade. It must also be remembered that adding a coating to a turbine blade will increase the mass of the turbine blade. It would be undesirable to apply a coating to such a thickness that the increase in mass meant that the original blade design needed to be changed and re-tested.

The coating may have a surface roughness of less than 1 μm Ra. In some embodiments, a coating formed on a smooth substrate surface has a surface roughness of less than 1 μm Ra in its "as deposited" state (without requiring any subsequent polishing). However, it will be understood that that a conformal coating formed on a substrate surface already having a degree of surface roughness will typically also have a surface roughness due to the surface roughness of the underlying surface. Accordingly, in some embodiments, the coating is applied so that its surface roughness is no more than 1 μm Ra greater than the surface roughness of the underlying substrate surface In some embodiments, when the coating is exposed to wear/sliding or rotating contact against a bearing or a seal, the coating surface finish becomes polished and improved over time. This feature is not often present in many other coating materials such as HVOF spray coatings consisting of hard WC grains in a soft metal Co, CoCr or Ni metal matrix: the soft metal matrix is selectively worn or corroded leaving hard and sharp WC grains protruding therefrom, increasing its surface roughness and making the HVOF surface similar to sand-paper, and this is highly abrasive for seals and other counterbody materials.

This polishability of the coating of embodiments of the present disclosure can be explained by the homogeneous structure and mechanical properties of the coating, the absence of precipitates at the grain boundaries and also by the very small scale/fine size of the tungsten carbide nanoparticles, typically produced as so-called coherent precipitates, which have the crystalline lattice of the precipitate aligned with the lattice of the matrix. As a result, the coating wears uniformly without leaving harder "islands" or asperities projecting from the surface, which can result in unwanted abrasion of counter-surfaces and/or can increase aerodynamic drag for moving turbine blades. Low roughness and absence of asperities are believed also to be important factors in providing resistance to WDE. This is because high velocity lateral water jetting can be a significant mechanism of WDE, and such jetting can apply a tearing action and high shear stresses to asperities leading to loss of material.

The provision of a substantially uniform coating with low roughness/smooth surface reduces the need for post-coating grinding, lapping, honing, polishing and other finishing operations, and enables the coating of parts with complex shapes which would be very difficult or impossible to polish if the coating were rough.

The ability of certain coatings of the present disclosure to retain a good finish or even to become smoother and more polished when in use means that the coating remains non-abrasive for seals, bearings and counterbodies which are in sliding or rotating contact with the coated part. This can mean reduced wear of seals, and reduced leakage of hydraulic actuators, which as a result require less maintenance and can last longer.

Accordingly, in addition to coating turbine blades or vanes, coatings of the present disclosure may find utility as coatings on rotating and/or reciprocating shafts and plungers, such as hydraulic pistons and cylinders, gear box shafts, pump shafts, and other components which move against seals or bearings and have the coating applied in the areas in contact with the moving seals or bearings, where the coating after application is polished.

It is generally known that the mechanical processes involved in cavitation erosion are not dissimilar to those involved in water droplet erosion, and that materials which show good resistance to WDE are expected to have good resistance to cavitation. Accordingly, in addition to coating turbine blades or vanes, coatings of the present disclosure may find utility as coatings on components of pumps, valves and other devices exposed to fluid cavitation, thereby to prolong their life and to improve performance.

The coating may comprise at least a softer layer of the coating closer to the substrate consisting essentially of metallic tungsten optionally alloyed with fluorine, and a harder layer of the coating comprising the material of the first aspect.

The metallic tungsten of the softer layer may be alloyed with fluorine in an amount of 0.0004 to 0.31 wt % based on the total weight of the softer layer; optionally in an amount of 0.0014 to 0.19% based on the total weight of the softer layer.

The coating may further comprise a transition layer between the softer layer and the harder layer. A concentration of carbon in the transition layer may increase in a direction from the softer layer to the harder layer. The transition layer may have a thickness of at least 0.01 µm, optionally at least 0.1 µm. A ratio of thicknesses between the softer layer and the harder layer may be between 1:10 and 10:1. A total thickness of the softer and harder layers, and optionally the transition layer, may be from 1 to 50 µm, optionally from 1 to 100 µm, optionally from 1 to 200 µm.

In some embodiments, there may be formed a plurality of softer and harder layer pairs so as to form a multilayer structure of alternating layers. In some embodiments, there may be from 2 to 100 softer and harder layer pairs. In some embodiments, the multilayer structure may comprise a softer layer, a transition layer, a harder layer, a transition layer, a softer layer, a transition layer, a harder layer etc. In each of the transition layers, the concentration of carbon, for example in the form of tungsten carbide nanoparticles, may increase across the thickness of the transition layer in a direction from the softer layer to the harder layer. The formation of such transitional layers can be promoted by controlling the flow of the precursor gases and the pressure during the CVD process, and can be beneficial in that it can reduce stresses between the layers.

The provision of a transition layer with a gradient of carbon concentration between the softer and harder layers can help to reduce residual stresses and avoid abrupt thermal and mechanical mismatches at the layer boundaries and impede propagation of cracks.

The substrate may be a turbine or compressor blade or vane. Embodiments of the present disclosure are particularly suited to applications where the blade or vane is a steam turbine or steam compressor blade or vane, since these blades or vanes are subject to high-cycle, high-velocity water droplet impacts during operation, and need to resist WDE.

Viewed from a fourth aspect, there is provided a turbine or compressor blade or vane at least partially coated with a material of the first or second aspect.

Viewed from a fifth aspect, there is provided a pump impeller, propeller, valve or other component, subject to cavitation in a liquid, at least partially coated with a material of the first or second aspect.

Viewed from a sixth aspect, there is provided a method of providing a turbine or compressor blade or vane with resistance to water droplet erosion, the method comprising at least partially coating the blade or vane with the material of the first, second or third aspect by way of chemical vapour deposition.

Viewed from a seventh aspect, there is provided a method of providing a pump impellor, propeller, valve or other component with resistance to cavitation, the method comprising at least partially coating the component with the material of the first, second or third aspect.

Viewed from an eighth aspect, there is provided a method of producing the material of the first or second aspect by chemical vapour deposition from a gaseous phase comprising a mixture of $WF_6$, hydrogen and at least one hydrocarbon, and optionally an inert gas, the gaseous phase having an oxygen content of no more than 10 ppm and a water content of no more than 3 ppm. Advantageously, a surface of a part being coated by the material of the first aspect is also treated or configured to be substantially free of oxygen and water vapour, as is the inside of any reaction chamber being employed for the method.

The present Applicant has determined that the presence of tungsten oxides and oxy-fluorides can have a negative effect on the mechanical properties of materials and coatings produced by CVD in a CVD reactor chamber. Accordingly, embodiments of the present disclosure use alkanes as the carbon-containing precursors (e.g. methane, ethane, propane)—these do not contain oxygen. Steps may also be taken to prevent or reduce the formation of tungsten oxides and oxy-fluorides. These steps may include one or more of the following:

i) Making the CVD reactor chamber and its gas system vacuum-tight so as to prevent any air from leaking into the chamber or gas system; this can be achieved by using a vacuum-tight system design and components and by testing the vacuum-tightness of the chamber flanges and seals and other components with a helium leak detector after every reactor opening. The helium leak limit may be set, for example, at $1 \times 10^{-9}$ mbar·l/s. If this limit is exceeded, then the reactor is opened, the flanges and seals are cleaned, the reactor is closed and another helium leak test is performed so as to ensure that the limit is met.

ii) Purging and de-gassing the CVD reactor chamber and loaded components prior to the coating process to remove adsorbed water and oxygen, for example by heating the chamber and loaded components in a vacuum and optionally performing a series of cycles of filling the reactor chamber with an inert gas to a specified partial pressure before evacuating the chamber to a specified vacuum pressure to remove traces of adsorbed oxygen and/or water from the surfaces of the chamber and the loaded components. The present Applicant has found that large CVD reactors, which may have internal stainless steel surfaces of area more than 10 m² inside the vacuum chamber, adsorb a significant amount of water vapour when the chamber is opened to load components before CVD processing. Water-cooled areas of the reactor chamber, such as the cooled vacuum seal area, were found to be especially exposed to such water condensation. It has also been found that the stainless steel surfaces can adsorb oxygen. The present Applicant has surprisingly found that de-gassing the vacuum chamber before each CVD cycle and using higher purity gases (in particular the hydrogen reducing gas and alkane gas) will result in a substantially oxygen-free coating with significantly improved mechanical properties.

iii) Using precursor and process gases that are substantially oxygen-free and water-free, for example to obtain a reactive gas mixture having an oxygen content of no more than 10 ppm and a water content of no more than 3 ppm. The purity of precursors and process gases was found especially important when using hydrogen gas in coating processes, as industrial grade hydrogen is normally produced by electrolysis, and as a result contains significant amounts of water vapour and often traces of oxygen.

iv) Back-filling the CVD reactor chamber with substantially oxygen- and water-free inert gas after completion of the coating process while the coated material is allowed to cool.

v) Allowing the coated parts to cool down to a temperature of no more than 200° C. before opening the reactor chamber, so as to reduce sub-surface oxidation of the deposited coatings.

As a result, it is possible to avoid inclusions of tungsten oxides and oxy-fluorides, and to deposit a material or coating that is substantially oxygen-free in its bulk.

The gaseous phase may be non-ionized. Alternatively or in addition, the gaseous phase may be chemically active during the deposition process.

The method may be performed at a temperature of 320 to 580° C. with the gaseous phase mixture of $WF_6$, hydrogen and at least one hydrocarbon and optionally an inert gas such as argon, at a pressure of 0.1 to 5 kPa for at least 10 minutes.

The at least one hydrocarbon may comprise or consist of a gaseous alkane.

The at least one hydrocarbon may be thermally activated by heating to a temperature of 500 to 850° C. prior to mixing with $WF_6$ and hydrogen.

Viewed from a ninth aspect, there is provided a method of resisting water droplet erosion of turbine or compressor blades or vanes, comprising coating the blades or vanes with a material of the first or second aspect.

Viewed from a tenth aspect, there is provided a method of resisting cavitation erosion of pump impellors, propellers, valves or other components, comprising coating the component with a material of the first or second aspect.

BRIEF DESCRIPTION OF THE DRAWINGS

Embodiments of the invention are further described hereinafter with reference to the accompanying drawings, in which.

DETAILED DESCRIPTION

Figure 1:
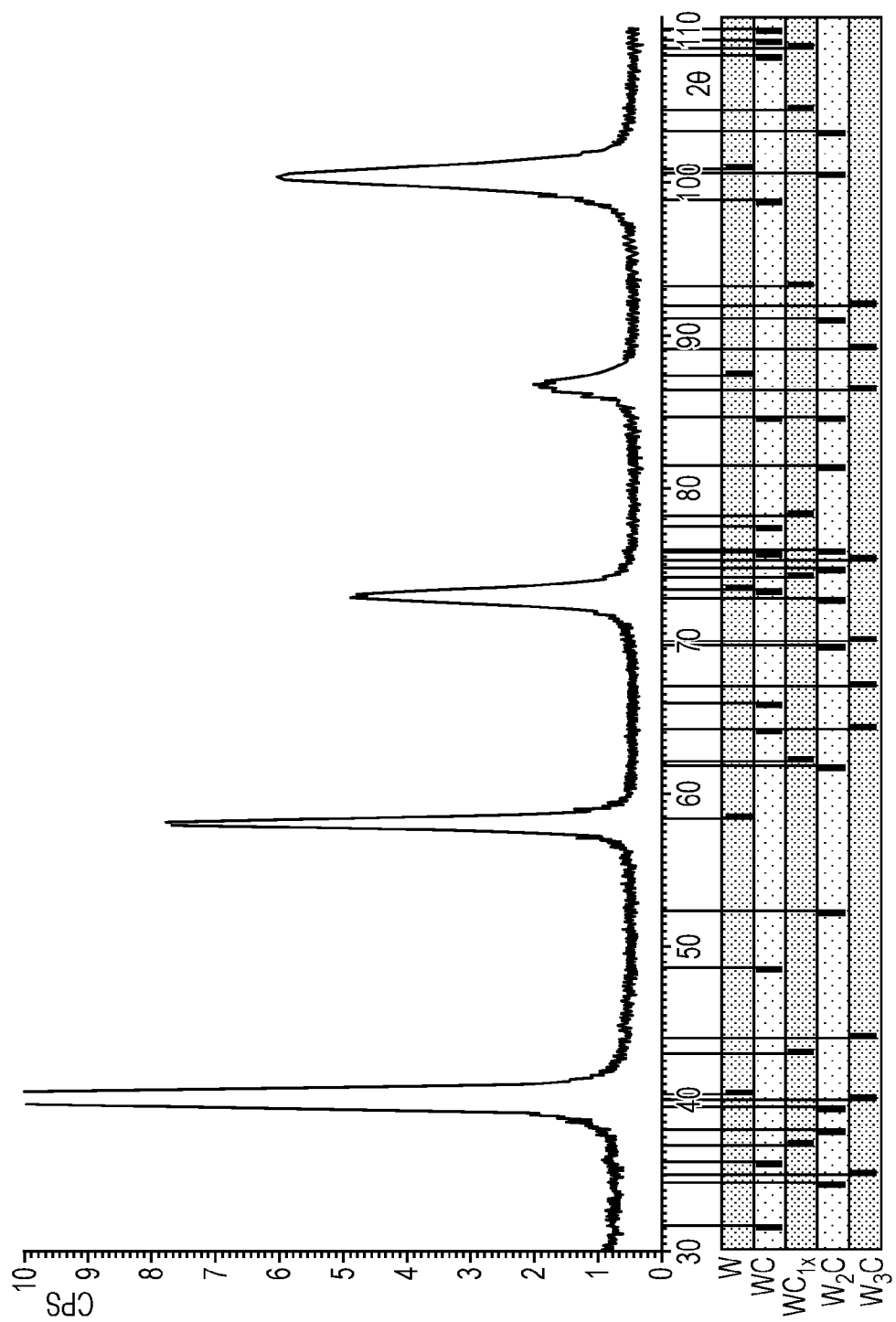
FIG. 1 is an X-ray diffraction spectrum for a material of an embodiment of the disclosure.

In order to study the effects of water droplet erosion on turbine blades, a rig comprising a high-speed rotor revolving at >5700 rpm was set up in an evacuated chamber. Sample materials were secured at either end of the rotor and subjected to water droplet impingement by way of a nozzle of selected diameter and stand-off distance. Testing was undertaken at the National Physical Laboratory (NPL), the UK's National Measurement Institute, which is a world-leading centre of excellence in developing and applying the most accurate measurement standards, science and technology available.

TABLE 1

| Test conditions | |
| --- | --- |
| Parameter | Value |
| Nozzle emerging droplet size | 350 μm |
| Rotor tip speed | 300 ms$^{-1}$ |
| Chamber operating pressure | 16 mbar |
| Test increment duration | 120 minutes |

Various test sample were evaluated as follows:

TABLE 2

| Test Samples | | | | |
| --- | --- | --- | --- | --- |
| Coating type | Sample Numbers | Coating thickness, μm | Coating hardness | Coating roughness Ra measured in two directions, μm |
| CVD partly carbided tungsten coating type 1 | 3, 7 | 120 to 140 | 940 Hv | N3: 0.20/0.33<br>N7: 0.12/0.39<br>N11: 0.15/0.35<br>N14: 0.30/0.59<br>N15: 0.22/0.28 |
| CVD partly carbided tungsten coating type 2 | 26, 29 | 50 to 60 | 1400 Hv | N33: 0.24/0.26<br>N26: 0.48/0.61<br>N32: 0.23/0.45<br>N29: 0.21/0.36<br>N34: 0.34/0.27 |
| Uncoated controls | 3 off, no numbers engraved | n/a | n/a | Not measured |

The residual stresses in the coatings were measured using X-ray diffraction techniques: the stresses result in changes of the interatomic distances in the coating material crystalline lattices, which can be measured by the shift of the characteristic X-ray diffraction lines. All the measurements of various coating samples representing the embodiments of the present disclosure showed compressive residual stresses. The measurements for the CVD partly-carbided tungsten coating type 1 with various thicknesses and other characteristics showed residual stress values from 520 MPa to 1100 MPa, and after additional grinding and dressing operations showed residual stress values from 1094 MPa to 2552 MPa. The measurements for the CVD partly-carbided tungsten coating type 2 with various thicknesses and other parameters showed residual stress values from 810 MPa to 2630 MPa, and after additional grinding and dressing operations showed residual stress values up to 5300 MPa.

The chemical composition for each coating type was analysed. The carbon content was analysed using an Eltra® combustion analyser: a free-standing coating sample was inserted into the induction furnace and combusted in an oxygen atmosphere. During combustion, the carbon components of the sample were oxidised to carbon dioxide ($CO_2$), and the carbon dioxide was selectively measured with infrared detectors. The readings were linearised, integrated and divided by the sample weight before being displayed, as percentages by weight, of total carbon. The following results were produced for the samples of CVD partly-carbided tungsten coating type 1 deposited in the same cycle as samples N3 and N7:

TABLE 3

| Sample N1 | Total carbon content |
| --- | --- |
| Analysis #1 | 0.0339% |
| Analysis #2 | 0.0356% |
| Analysis #3 | 0.0318% |

The following results were produced for the samples of CVD partly-carbided tungsten coating type 2 deposited in the same cycle as samples N26 and N29:

TABLE 4

| Sample N4 | Total carbon content |
| --- | --- |
| Flake #1 | 0.0698% |
| Flake #2 | 0.0539% |
| Flake #3 | 0.0560% |
| Flake #4 | 0.0513% |

Other samples of CVD partly-carbided tungsten coating were produced with a carbon content ranging from 0.000927 wt % to 0.3697 wt %.

The fluorine content was analysed using a Secondary Ions Mass Spectroscopy (SIMS) method. Samples of the CVD partly-carbided tungsten coating were produced with a fluorine content ranging from 0.0004 wt % to 0.3093 wt %.

The oxygen content was analysed using a Secondary Ions Mass Spectroscopy (SIMS) method, after the external oxidised layer of the coating was removed by an ion beam etching technique. This analysis did not produce a measurable signal for oxygen from the various coating samples representing embodiments of the present disclosure.

FIG. 1 shows an X-ray diffraction (XRD) spectrum of the coating on sample N22, coated together with samples N26 and N29. The spectrum shows all of the characteristic peaks of metal tungsten, but does not show the sets of peaks characteristic for any of the tungsten carbides. This supports the view that tungsten carbide particles forming the tungsten alloyed with carbon material of embodiments of the present disclosure are indeed nanoparticles and not macro- or microparticles.

The fracture toughness of various coating samples representing embodiments of the present disclosure was measured by making a series of diamond cube-corner indentations and also Vickers indentations and inspecting the indentations for cracks extending from corners of the indentations. None of the samples showed any cracks induced by these methods, this showed a lower limit of the coating fracture toughness of at least 9 MPa·m$^{1/2}$.

Measurements were taken of mass loss vs number of rotor arm/jet impingements (interactions) vs time for the whole sample inventory. Samples N3 and N7 were coated with CVD partly-carbided tungsten coating type 1, N26 and N29 with CVD partly-carbided tungsten coating type 2. The substrate was 410 stainless steel. Some uncoated samples were used as controls and showed rapid loss of mass due to WDE.

Figure 2:
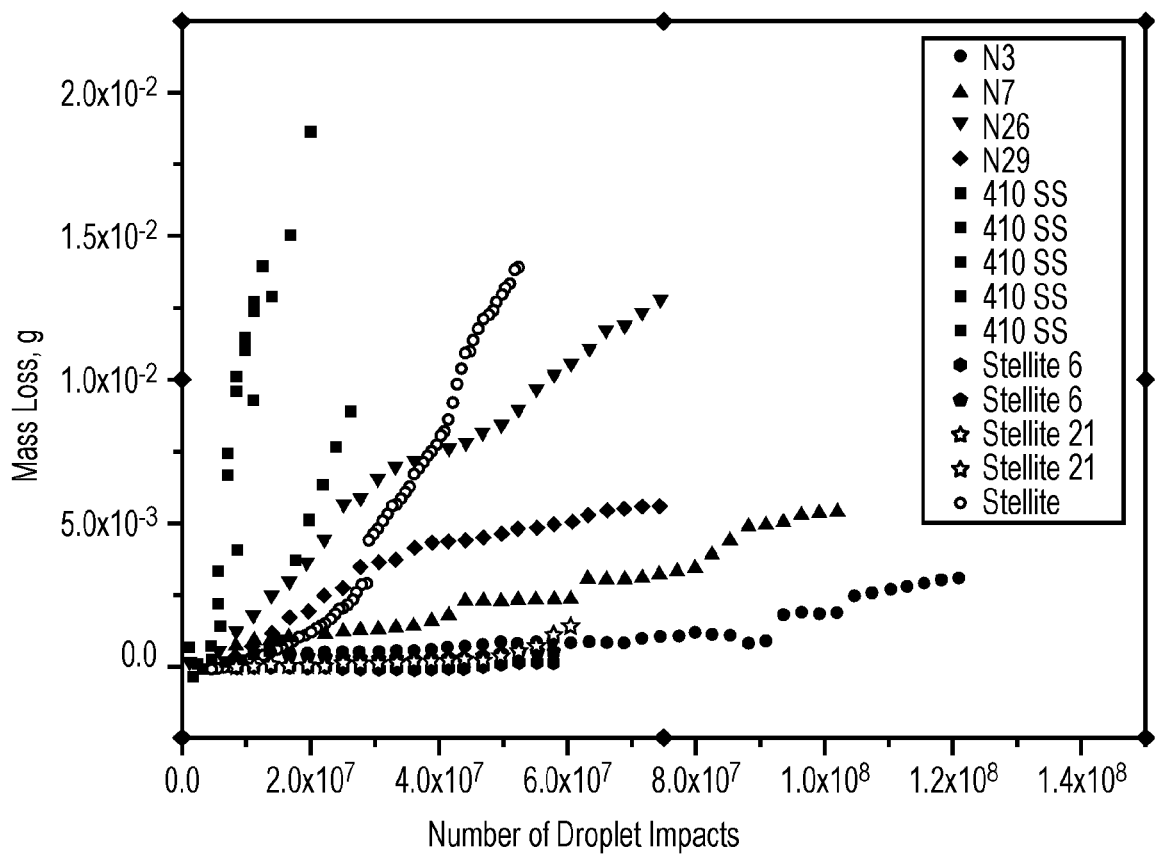
FIG. 2 is a plot of number of droplet impacts against mass loss for various coated samples as determined by a test rig.

The results were plotted as mass loss against time as shown in FIG. 2. The current test results are compared to historical results carried out in previous studies on monolithic uncoated samples from a martensitic 410 stainless steel and three different types of Stellite®. There were five repeat tests on the 410 stainless steel material, and two each on the Stellite® 6 and Stellite® 21 materials. Stellite® 6 is a cobalt-based alloy that consists of complex carbides in an alloy matrix. The alloy nominal composition is: 27-32 wt % Cr, 4-6 wt % W, 0.9-1.4 wt % C, with the remainder being cobalt. Stellite® 21 (also known as Stellite® 8) is a cobalt-based alloy that consists of a CoCrMo alloy matrix containing dispersed hard carbides. The alloy nominal composition is: 26-29 wt % Cr, 4.5-6 wt % Mo, 0.2-0.35 wt % C, 2.0-3.0 wt % Ni, with the remainder being cobalt.

The good repeatability of these tests can be seen by the 410 SS results which overlay one another very closely. The CVD partly-carbided tungsten coating samples N3, N7, N26 and N29 all have significantly lower mass loss than the 410 SS samples, but all have differing amounts of mass loss as the duration of the test increases. The N3 samples shows a very slow increase in mass loss. The Stellite® 6 and Stellite® 21 samples show little increase in mass loss until $2 \times 10^8$ water droplet impacts. However, the other Stellite® material has undergone significant mass loss by $1 \times 10^8$ water droplet impacts. The CVD partly carbided tungsten coating samples show steps in the mass loss curves, suggesting that there is a significant loss of material from the samples at these steps. It should be remembered that mass loss is a fairly crude measure of water droplet erosion. For example, it was found that some samples (e.g. N26 and N29) showed some chipping at edge regions outside the main test area, this chipping possibly being due to mechanical deformation of the samples when being repeatedly removed and then re-fitted to the test rig for weight measurements between each 2 hour testing session. Loss of coating material due to this chipping will show as a significant mass loss on the plots of FIG. 2, although the actual damage due to water droplet erosion in the test area is found to be negligible.

Figure 3:
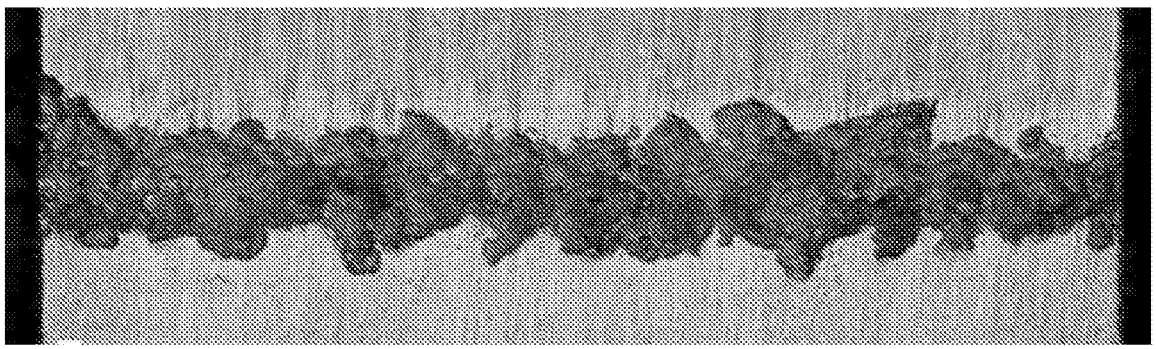
FIG. 3 is a plan view of an uncoated stainless steel sample after water droplet erosion testing with approximately 10 million water droplet impacts.
Figure 4:
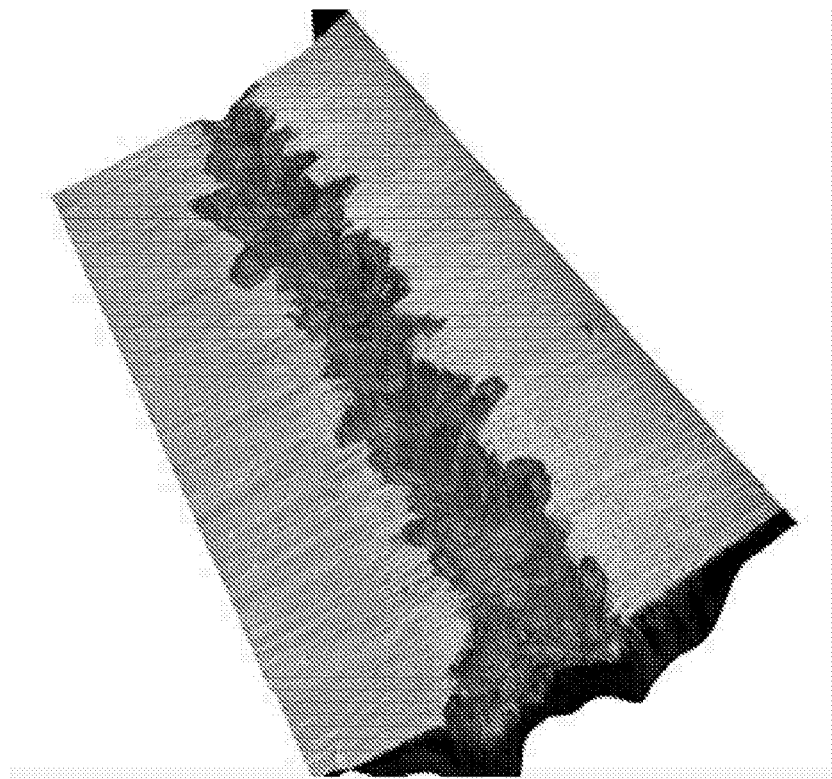
FIG. 4 is a perspective view of the sample of FIG. 3.

An optical microscope was used to examine the surfaces of the samples. FIGS. 3 and 4 show, respectively, a plan view and a perspective view of an uncoated 410 SS sample after $10^7$ water droplet impacts. A very distinct wear scar of length 8 mm was observed across the whole width of the sample.

In the following tests, an Alicona® Infinitefocus microscope was used to examine the surfaces of the wear scar regions of the samples. This microscope gives high quality images of the sample surface as well as 3D height information on the surface. The first figure of each set (FIGS. 6, 9, 12, 15) shows a view where the image is shown in a 3D projection of the surface showing the whole of the wear scar, and the second image (FIGS. 7, 10, 13, 16) shows a plot of the height profile taken across a central region of each sample perpendicular to the direction of the water jet.

Figure 5:
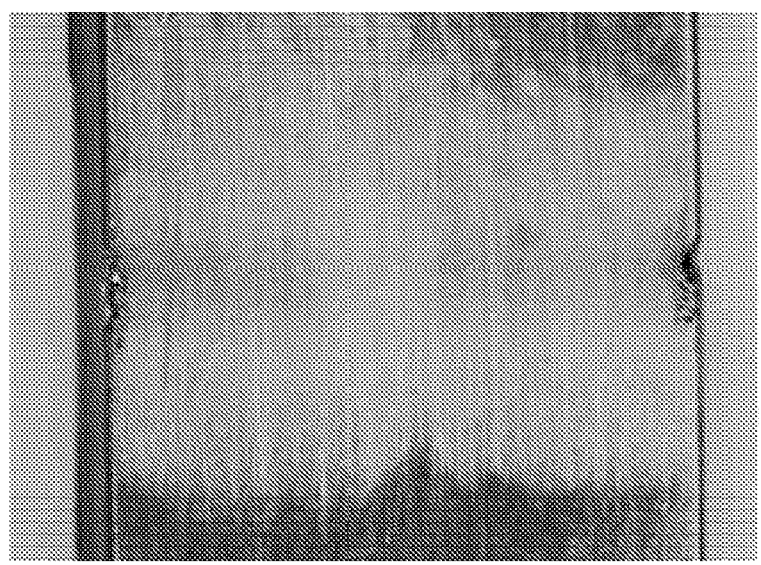
FIG. 5 is a plan view of a first sample coated in accordance with the present disclosure after water droplet erosion testing with approximately 121 million water droplet impacts.
Figure 6:
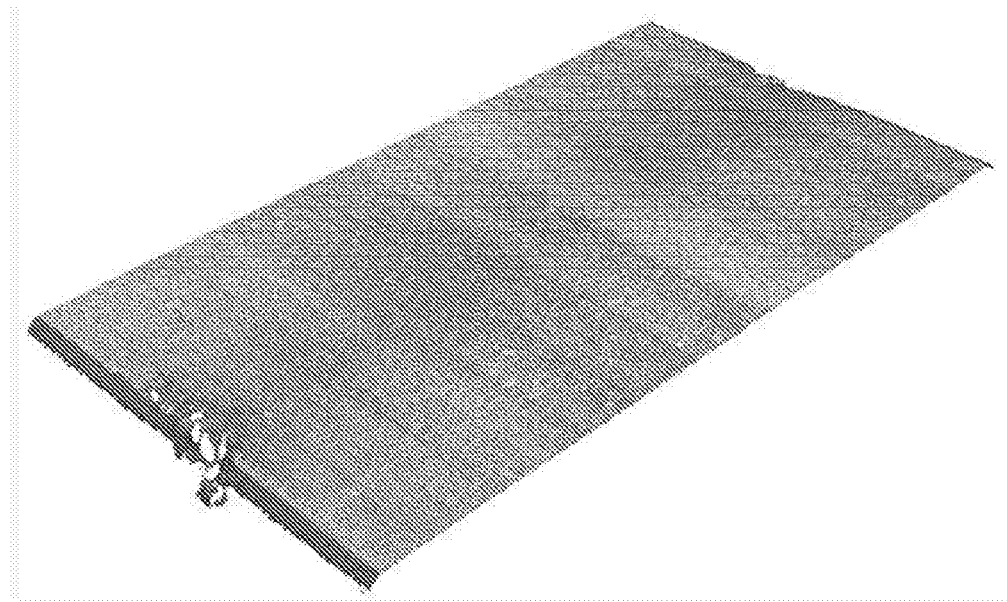
FIG. 6 is a 3D scan of the first sample showing a height map of the surface of the first sample after water droplet erosion testing.

FIG. 5 shows a plan view of sample N3 after WDE testing with around $1.2 \times 10^8$ water droplet impacts. FIG. 6 shows a plan view of sample N7 after WDE testing with around $1.0 \times 10^8$ water droplet impacts. The WDE test was applied across the whole sample width, but unlike the control uncoated 410 SS sample shown in FIG. 4, both CVD partly-carbided tungsten coating type 1 samples only show some localized damage near the sample corners, but no discernible damage to the rest of the tested zone after more than 10 times longer exposure to WDE. For both samples N3 and N7 there is discoloration of the samples to the side of the area where the water jet has impacted the sample. This is thought to be due to oxidation of the surface of the sample due to the raised temperature caused by the erosion process. The central zone of the wear scar for sample N3, in FIG. 5, shows some "darkening" which may be indicative of some damage. There is a definite notch forming at one edge of the sample where the water droplets impact the sample.

Figure 7:
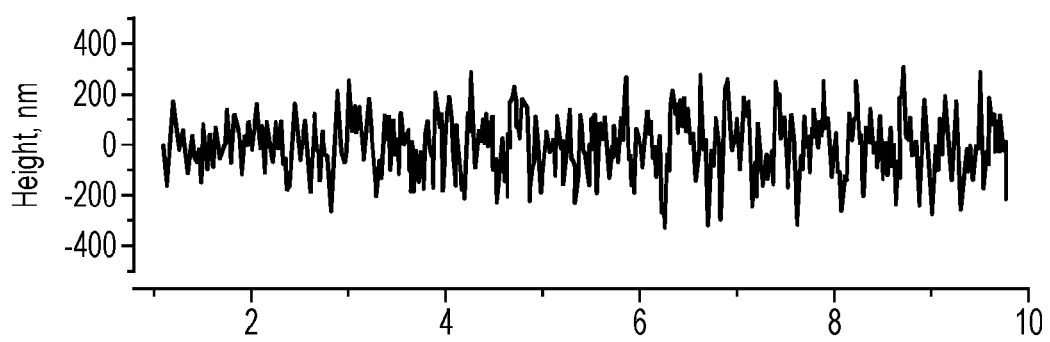
FIG. 7 is a plot of the height profile taken across a test area of the first sample after water droplet erosion testing.

FIG. 6 shows an Alicona® scan of sample N3 after testing. The height map shows some damage near the sample edges in the tested area, but the sample has little or no damage in the middle of the tested area, as shown in FIG. 7.

Figure 8:
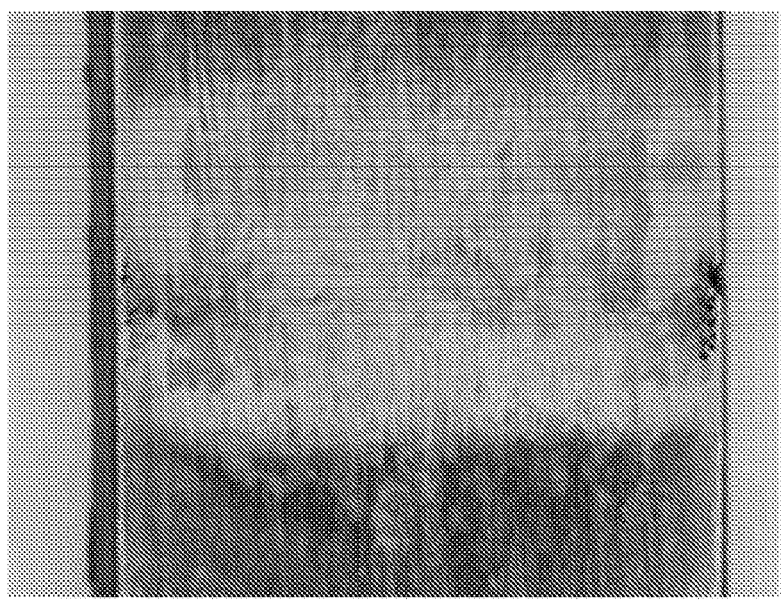
FIG. 8 is a plan view of a second sample coated in accordance with the present disclosure after water droplet erosion testing with approximately 101 million water droplet impacts.

Sample N7, in FIG. 8, shows very little damage across the sample with some damage at the edge of the wear scar. There is possibly some reduction in the visibility of the scratches from the original sample preparation of the surface in the centre of the wear scar.

Figure 9:
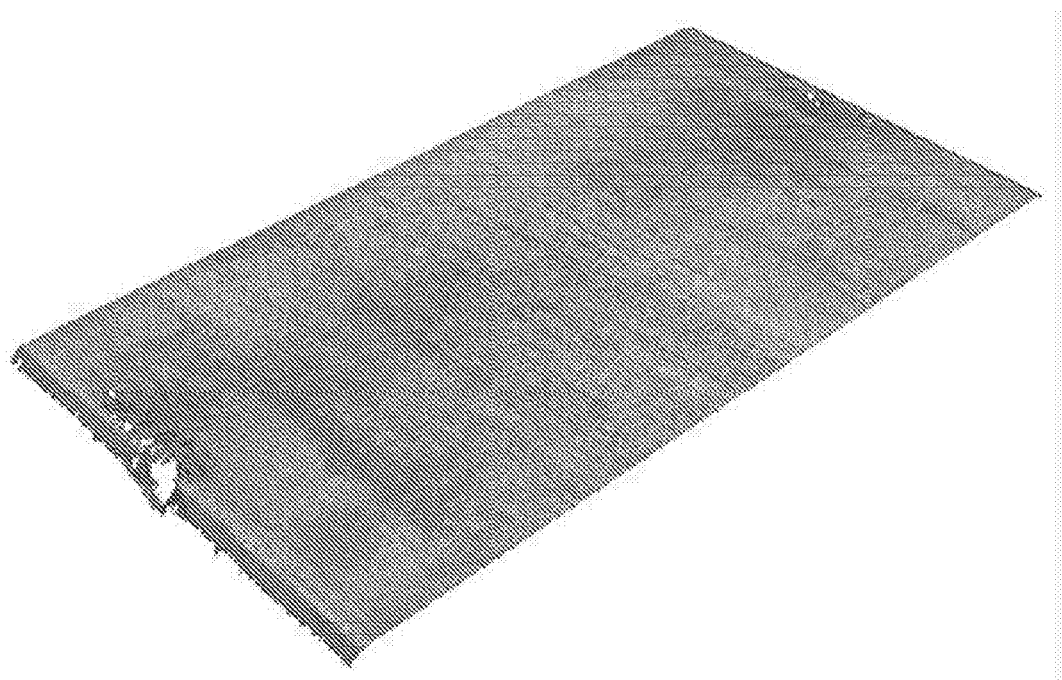
FIG. 9 is a 3D scan of the second sample showing a height map of the surface of the second sample after water droplet erosion testing.
Figure 10:
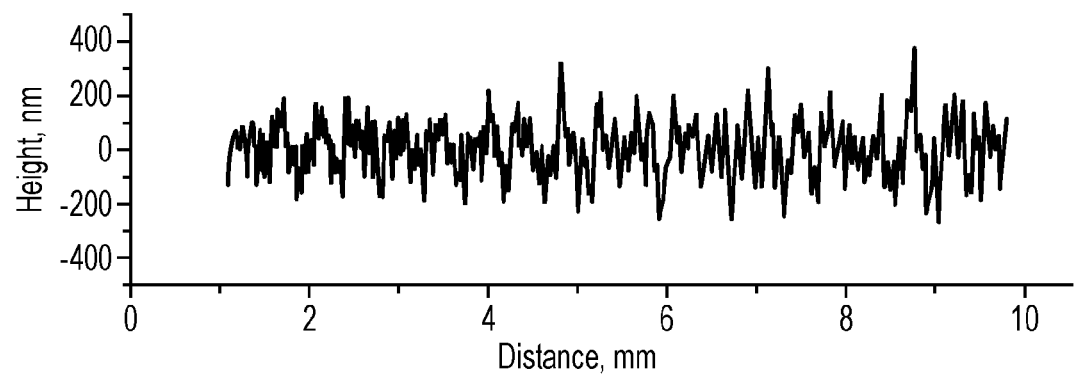
FIG. 10 is a plot of the height profile taken across a test area of the second sample after water droplet erosion testing.

FIG. 9 shows an Alicona® scan of sample N7 after testing. The height map shows some damage near the sample edges in the tested area, but the sample has little or no damage in the middle of the tested area, as shown in FIG. 10.

Figure 11:
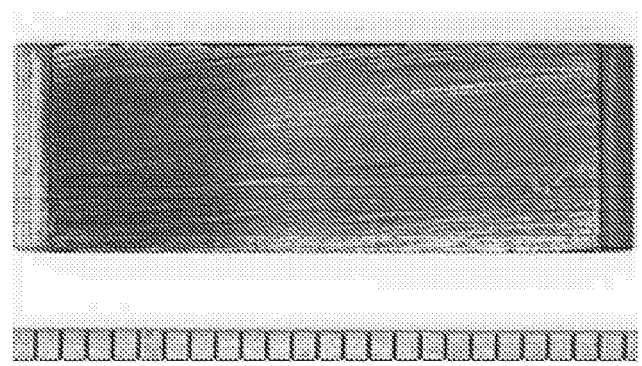
FIG. 11 is a plan view of a third sample coated in accordance with the present disclosure after water droplet erosion testing with approximately 74 million water droplet impacts.

Sample N29, in FIG. 11, shows chipping damage at one edge of the sample outside of the tested area. It is possible that this damage was caused by deformation of the sample when being repeatedly removed and then re-fitted to the test rig for weight measurements between each 2 hour testing session. The tested area in the middle of the sample shows no visible damage due to WDE.

Figure 12:
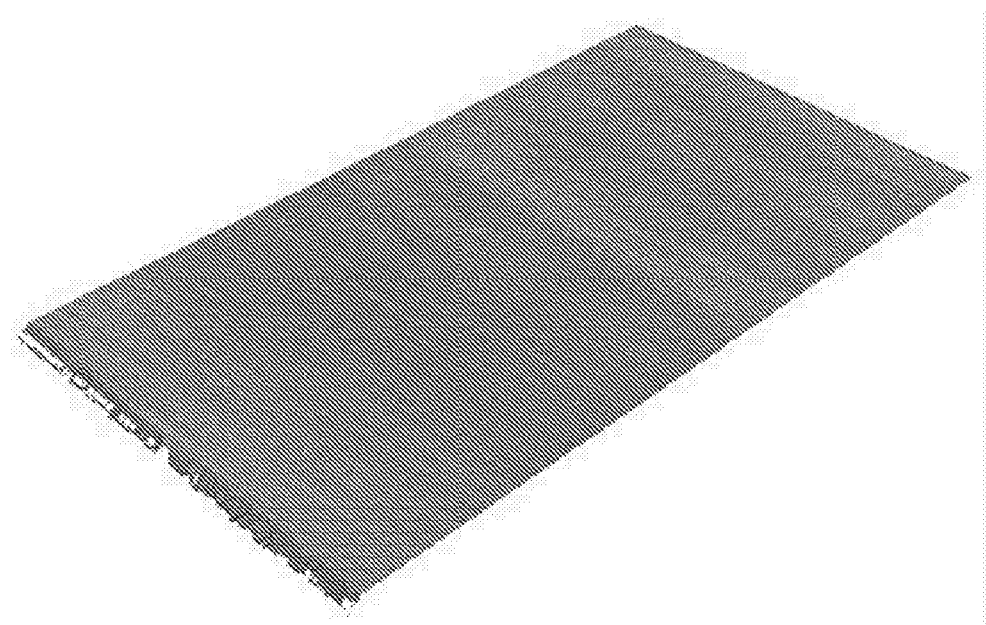
FIG. 12 is a 3D scan of the third sample showing a height map of the surface of the third sample after water droplet erosion testing.
Figure 13:
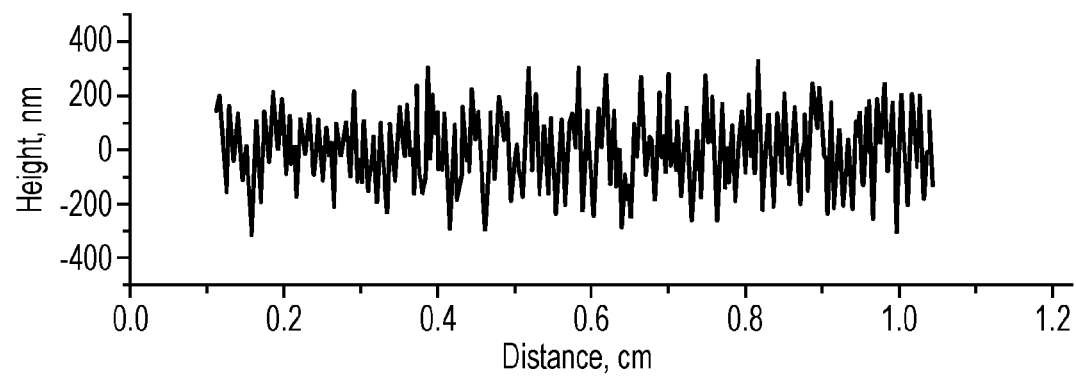
FIG. 13 is a plot of the height profile taken across a test area of the third sample after water droplet erosion testing.

FIG. 12 shows an Alicona® scan of sample N29 after testing. The height map shows no detectable damage in the middle of the tested area, as shown in FIG. 13.

Figure 14:
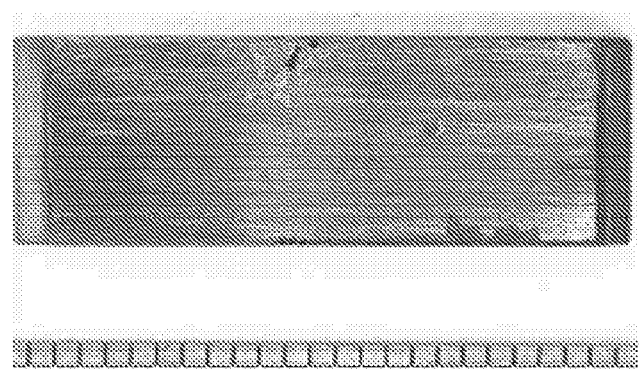
FIG. 14 is a plan view of a fourth sample coated in accordance with the present disclosure after water droplet erosion testing with approximately 74 million water droplet impacts.

Sample N26, in FIG. 14, shows extensive chipping damage at the edges of the sample outside the tested area, again most likely due to stressing or deformation when repeatedly removing and re-fitting the sample to the test rig. The tested area shows some branched damage due to WDE that extends about 2.7 mm across the sample.

Figure 15:
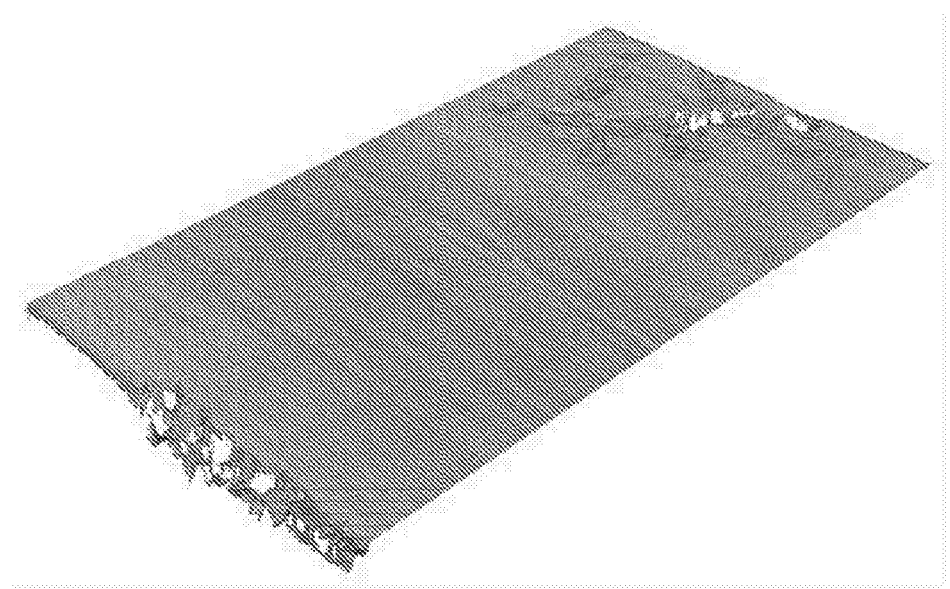
FIG. 15 is a 3D scan of the fourth sample showing a height map of the surface of the fourth sample after water droplet erosion testing.
Figure 16:
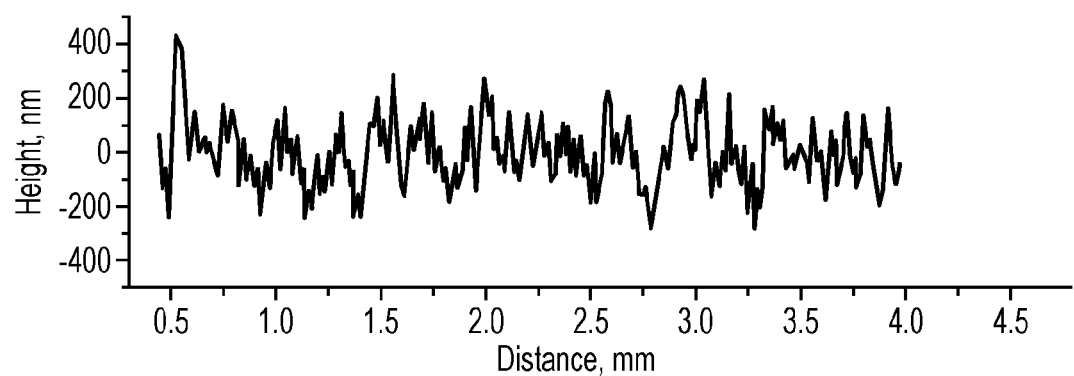
FIG. 16 is a plot of the height profile taken across a test area of the fourth sample after water droplet erosion testing.

FIG. 15 shows an Alicona® scan of sample N26 after testing. The height map of this sample shows some damage to the sample face edges and also some WDE damage on one side which looks branched that extends about 2.7 mm across the sample. This structure appears to be stepped, and has a depth of 18 μm over most of the area of the feature. The middle part of the tested area shows no measurable damage to the coating, as shown in FIG. 16.

With the exception of sample N26, these scans show little discernable damage from the water droplet erosion in the central region of the wear scars visualized both in the 3D views and the profiles of the samples. For sample N26, however, tree-like branched damage is visible across an appreciable fraction of the width of the sample.

Figure 17:
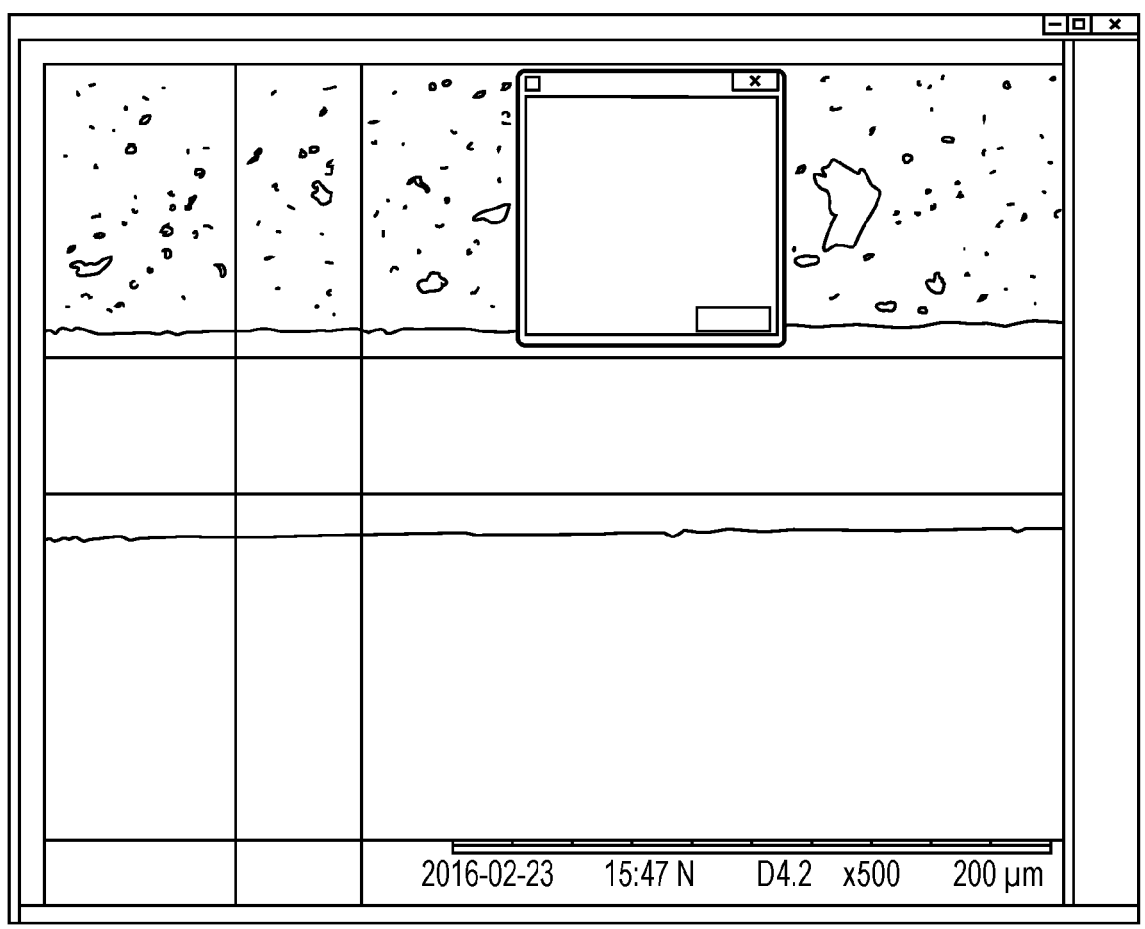
FIG. 17 shows a cross section through a fifth sample coated in accordance with the present disclosure, with porosity analysis undertaken by a software package.

FIG. 17 shows a cross section through the CVD partly-carbided tungsten coating layer of sample N34, with porosity analysis undertaken using Gwyddion image analysis software. The porosity was determined to be 0.00%.

Figure 18:
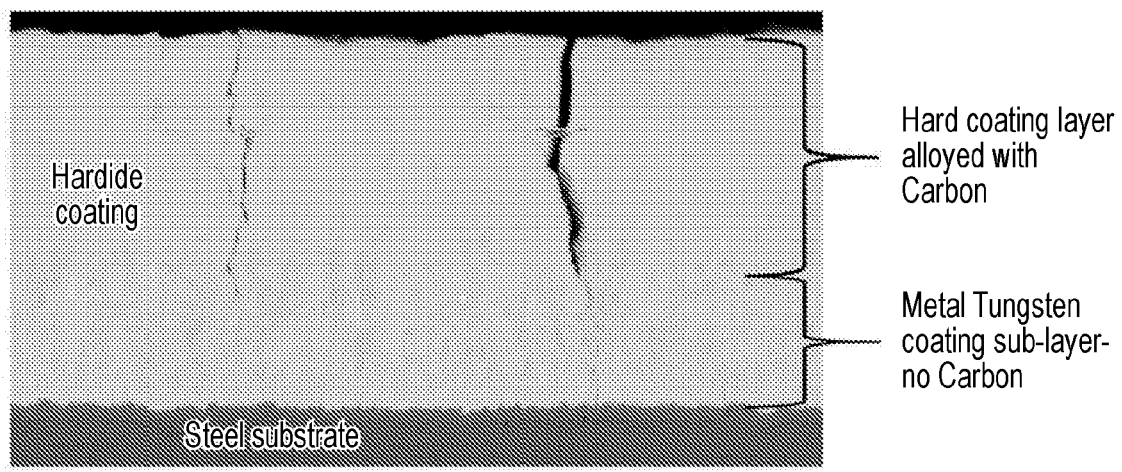
FIG. 18 shows a cross section through the fourth sample showing resistance to propagation of micro-cracks.

FIG. 18 shows a cross section through a WDE-tested coating sample N26 on a steel substrate in accordance with an embodiment of the present disclosure, in which the coating comprises a softer, metal tungsten layer on the substrate and a harder, tungsten alloyed with carbon layer applied over the softer layer. This section shows the area with the branched damage from WDE on the coating surface. It can be seen that micro-cracks initiated in the upper, harder layer by WDE tend to be arrested at the boundary between the upper, harder layer and the lower, softer layer. SEM examination of this sample cross section surprisingly revealed that, in the branched damage area, the thickness of the remaining area was measured in many locations at around 10 to 12 μm, which is the thickness of the softer metal tungsten layer. This demonstrated that in the branched damage area, the top coating layer made of harder tungsten alloyed with carbon was significantly damaged or lost, while the softer more ductile metal tungsten layer nearest to the substrate remained mostly undamaged. Accordingly, the present Applicant has surprisingly shown that a layered coating structure which includes alternating layers of ductile tungsten layers and harder carbon-alloyed tungsten layers can be an effective protection against WDE.

Figure 19:
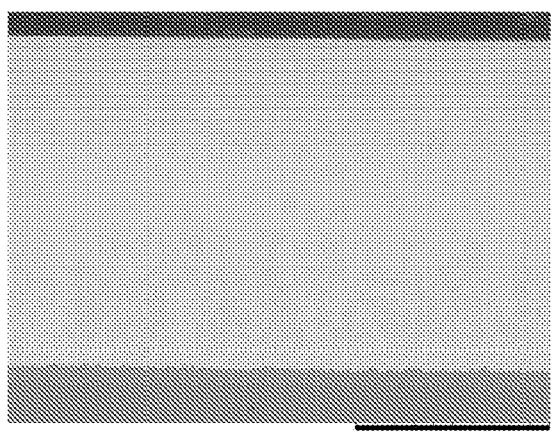
FIG. 19 shows a CVD coating cross-section used to determine porosity in accordance with ASTM E2109.

FIG. 19 shows a CVD coating cross-section used to determine porosity in accordance with ASTM E2109-01 Standard Test Methods for Determining Area Percentage Porosity in Thermal Sprayed Coatings. The coating is essentially free from porosity and inclusions.

Figure 20:
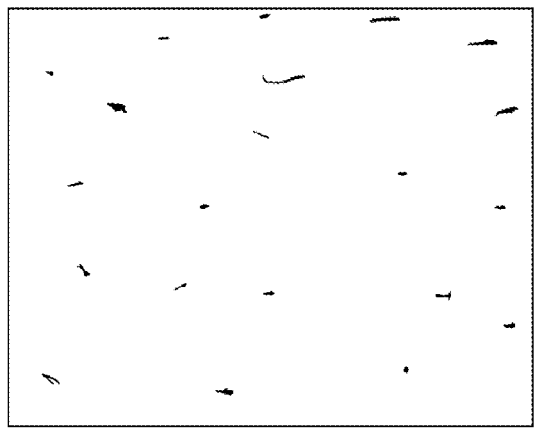
FIG. 20 shows a test image from the ASTM E2109-01 standard presenting the lowest porosity level of 0.5% which is used for the visual determination of the area percentage porosity of coatings.

FIG. 20 is a test image from the ASTM E2109-01 standard presenting the lowest porosity level of 0.5% which is used for the visual determination of the area percentage porosity of coatings.

Figure 21:
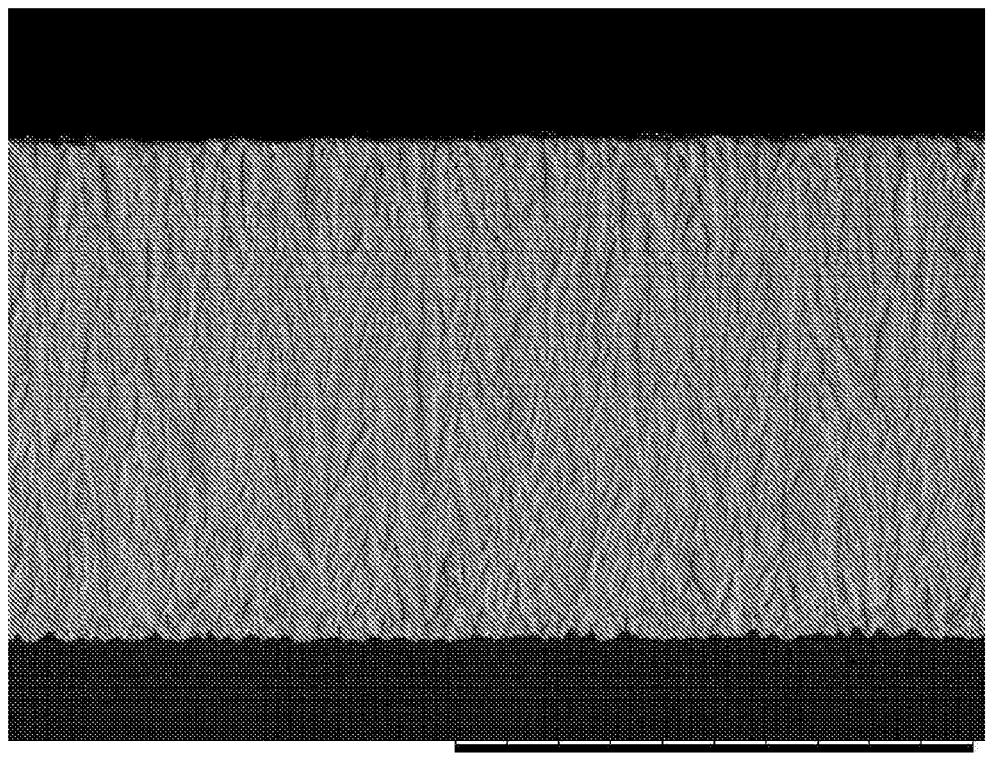
FIG. 21 shows a cross-section of the CVD coating under a scanning electron microscope in shadow mode.

FIG. 21 shows a cross-section of the CVD coating under a scanning electron microscope in shadow mode. The columnar crystalline microstructure of the coating is clearly visible.

Figure 22:
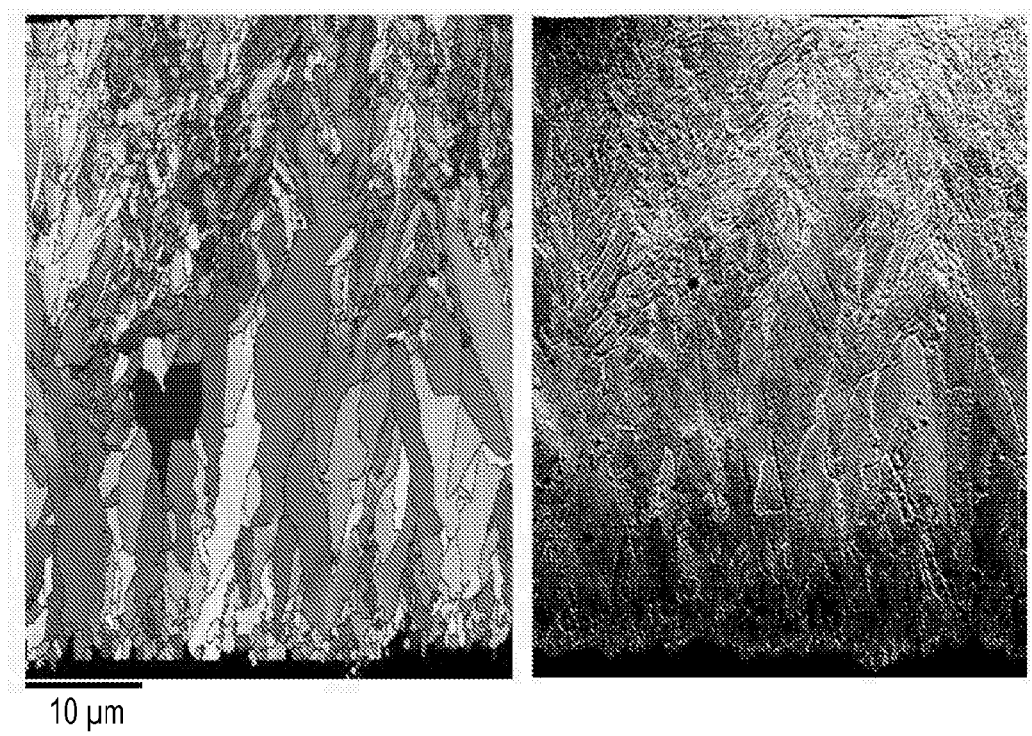
FIG. 22 shows a cross-section of the CVD coating under electron backscatter diffraction (EBSD) analysis.

FIG. 22 shows a cross-section of the CVD coating obtained by electron backscatter diffraction (EBSD) analysis, both in false colour and in monochrome. Again, this clearly shows columnar crystalline microstructure of the coating. EBSD analysis is an effective method for the microstructural-crystallographic characterisation of materials Throughout the description and claims of this specification, the words "comprise" and "contain" and variations of them mean "including but not limited to", and they are not intended to (and do not) exclude other moieties, additives, components, integers or steps.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments.

The reader's attention is directed to all papers and documents which are filed concurrently with or previous to this specification in connection with this application and which are open to public inspection with this specification, and the contents of all such papers and documents are incorporated herein by reference.

The invention claimed is:

1. An erosion- and corrosion-resistant material coated on a substrate, the material comprising metallic tungsten alloyed with carbon in the form of a matrix of metallic tungsten with interdispersed tungsten carbide nanoparticles in a substantially uniform nano-structure that is substantially free of oxygen, other than at surface portions exposed to air or moisture, wherein the material has a columnar crystalline microstructure.

2. A material as claimed in claim 1, wherein the metallic tungsten is alloyed with carbon in an amount of 0.0001 to 0.37 wt % based on the total weight of the material.

3. A material as claimed in claim 1, consisting essentially of metallic tungsten alloyed with carbon, optionally further alloyed with fluorine.

4. A material as claimed in claim 1, wherein the metallic tungsten is further alloyed with fluorine.

5. A material as claimed in claim 4, wherein the metallic tungsten is alloyed with fluorine in an amount of 0.0004 to 0.31 wt % based on the total weight of the material.

6. A material as claimed in claim 4, wherein the material is substantially free of oxyfluorides.

7. A material as claimed in claim 1, wherein the material does not exhibit peaks characteristic of inclusions having an A15 crystal structure when subjected to X-ray diffraction analysis.

8. A material as claimed in claim 1, wherein the material does not exhibit peaks characteristic of tungsten carbides having an A15 crystal structure when subjected to X-ray diffraction analysis.

9. A material as claimed in claim 1, wherein the material is substantially non-porous.

10. A material as claimed in claim 1, wherein the material has a porosity of less than 0.5% volume.

11. A material as claimed in claim 1, having a composition of 97.60 to 99.99 wt % tungsten.

12. A material as claimed in claim 1, having a hardness from 4.4 GPa to 19 GPa.

13. A material as claimed in claim 1, having a fracture toughness of at least 9 MPa·m$^{1/2}$.

14. A material as claimed in claim 1, wherein the material is substantially free from porosity, voids and/or inclusions that act as stress concentrators.

15. A chemical vapour deposition material coated on a substrate as claimed in claim 1.

16. A material coated on a substrate as claimed in claim 15, wherein the material has a residual compressive stress of 520 MPa to 5.3 GPa.

17. A material coated on a substrate as claimed in claim 15, wherein the material has a thickness of at least 15 μm.

18. A material coated on a substrate as claimed in claim 15, wherein the material has a thickness no greater than 200 μm.

19. A material coated on a substrate as claimed in claim 15, having a surface roughness of less than 1 μm Ra.

20. A material coated on a substrate as claimed in claim 15, wherein the material as deposited by chemical vapour deposition has a surface roughness no more than 1 μm Ra greater than a surface roughness of the substrate without requiring any polishing after deposition.

21. A material coated on a substrate as claimed in claim 15, comprising at least a softer layer of the coating closer to the substrate consisting essentially of metallic tungsten optionally alloyed with fluorine, and a harder layer of the coating comprising the material of claim 1.

22. A material coated on a substrate as claimed in claim 21, wherein the metallic tungsten of the softer layer is alloyed with fluorine in an amount of 0.0004 to 0.31 wt % based on the total weight of the softer layer.

23. A material coated on a substrate as claimed in claim 21, further comprising a transition layer between the softer layer and the harder layer.

24. A material coated on a substrate as claimed in claim 23, wherein a concentration of carbon in the transition layer increases in a direction from the softer layer to the harder layer.

25. A material coated on a substrate as claimed in claim 23, wherein the transition layer has a thickness of at least 0.01 μm.

26. A material coated on a substrate as claimed in claim 21, wherein a ratio of thicknesses between the softer layer and the harder layer is between 1:10 and 10:1.

27. A material coated on a substrate as claimed in claim 21, wherein a total thickness of the softer and harder layers is from 1 to 50 μm.

28. A material coated on a substrate as claimed in claim 15, comprising a plurality of softer and harder layer pairs so as to form a multilayer structure of alternating layers, and wherein the harder layer has the tungsten carbide nanoparticles in the substantially uniform nano-structure.

29. A material coated on a substrate as claimed in claim 28, comprising from 2 to 100 softer and harder layer pairs.

30. A method of providing a component with resistance to at least one of water droplet erosion and cavitation, the method comprising at least partially coating the component with the material of claim 1 by way of chemical vapour deposition, wherein the component is selected from the group consisting of one or more of: a turbine blade, a compressor blade, a turbine vane, a compressor vane, a steam turbine blade, a steam compressor blade, a steam turbine vane, a steam compressor vane, a pump impellor, a propeller, a valve, and a component subject to cavitation in a liquid.

31. A method of producing the material of claim 1 by chemical vapour deposition from a gaseous phase comprising a mixture of $WF_6$, hydrogen and at least one hydrocarbon, and optionally an inert gas, the gaseous phase having an oxygen content no more than 10 ppm and a water content no more than 3 ppm.

32. A method according to claim 31, wherein the gaseous phase is non-ionized.

33. A method according to claim 31, wherein the gaseous phase is chemically active during the deposition process.

34. A method according to claim 31, performed at a temperature of 320 to 580° C. with the gaseous phase mixture of $WF_6$, hydrogen and at least one hydrocarbon, and optionally an inert gas, at a pressure of 0.1 to 5 kPa for at least 10 minutes.

35. A method according to claim 31, wherein the at least one hydrocarbon comprises or consists of a gaseous alkane.

36. A method according to claim 31, wherein the at least one hydrocarbon is thermally activated by heating to a temperature of 500 to 850° C. prior to mixing with $WF_6$ and hydrogen.

37. A method according to claim 31, wherein the chemical vapour deposition takes place in a reaction chamber.

38. A method according to claim 37, wherein the reaction chamber is degassed by heating in a vacuum prior to the introduction of the gaseous phase.

39. A method according to claim 37, wherein the reaction chamber is filled with an inert gas, heated and then evacuated prior to the introduction of the gaseous phase.

40. A method according to claim 37, wherein the reaction chamber is vacuum tested each time it is closed after having been opened, optionally by way of a helium leak detector.

41. A method according to claim 37, wherein the material is allowed to cool to 200° C. or below before the reaction chamber is opened.

42. A method according to claim 31, wherein the material is cooled after deposition at an average rate of between 0.12° C. per minute and 1.9° C. per minute.

43. A method according to claim 31, wherein the material is deposited at a rate of 3.5 to 82 μm per hour.

44. A water droplet erosion resistant coating material coated on a substrate, the material comprising metallic tungsten alloyed with carbon in the form of a matrix of metallic tungsten with interdispersed tungsten carbide nanoparticles in a substantially uniform nano-structure that is substantially free of oxygen, other than at surface portions exposed to air or moisture, wherein the material has a columnar crystalline microstructure.

45. A component at least partially coated with a material as claimed in claim 1, wherein the component is selected from the group consisting of one or more of: a turbine blade, a compressor blade, a turbine vane, a compressor vane, a steam turbine blade, a steam compressor blade, a steam turbine vane, a steam compressor vane, a pump impellor, a propeller, a valve, and a component subject to cavitation in a liquid.

46. A material as claimed in claim 1, wherein the material has a porosity of less than 0.3% volume.

\* \* \* \* \*